United States Patent
Kashiwazaki

(10) Patent No.: US 6,724,228 B2
(45) Date of Patent: Apr. 20, 2004

(54) CLOCK GENERATING CIRCUIT CAPABLE OF GENERATING INTERNAL CLOCK ACCURATELY SYNCHRONIZED WITH EXTERNAL CLOCK

(75) Inventor: Yasuhiro Kashiwazaki, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/359,679

(22) Filed: Feb. 7, 2003

(65) Prior Publication Data
US 2004/0008064 A1 Jan. 15, 2004

(30) Foreign Application Priority Data
Jul. 15, 2002 (JP) ........................................ 2002-205411

(51) Int. Cl.[7] .............................. H03K 5/13; H03D 3/24
(52) U.S. Cl. ........................................ 327/158; 327/156
(58) Field of Search .................................. 327/156, 157, 327/158, 160, 161, 151, 149

(56) References Cited

U.S. PATENT DOCUMENTS 6,166,990 A  * 12/2000 Ooishi et al. ................ 365/233
6,504,408 B1  * 1/2003 von Kaenel ................ 327/158

* cited by examiner

Primary Examiner—Dinh T. Le
(74) Attorney, Agent, or Firm—McDermott, Will & Emery

(57) ABSTRACT

A phase difference between a feedback clock signal corresponding to an internal clock signal generated via a variable delay line and a buffered clock signal corresponding to an external clock signal is detected by a phase detector, and a result of detection is transferred via a shifting circuit. When a down signal from the shifting circuit is activated by a delay control circuit, the down instruction signal is forcibly maintained to be active for a predetermined clock cycle period. When the down instruction signal becomes inactive from the active state, a count control circuit sets a count unit of the counting circuit to the minimum value. The delay amount of the variable delay line is set according to an output count bit of the counting circuit. Therefore, it is possible to reduce the number of clock cycles required until an internal clock signal is synchronized in phase with the external clock signal.

17 Claims, 25 Drawing Sheets

CLOCK GENERATING CIRCUIT CAPABLE OF GENERATING INTERNAL CLOCK ACCURATELY SYNCHRONIZED WITH EXTERNAL CLOCK

BACKGROUND OF THE INVENTION

1. Field of the Invention

The present invention relates to a clock generating circuit for generating an internal clock signal synchronized with an external clock signal, and more particularly to an internal clock generating circuit for generating an internal clock signal used at least for outputting data in a synchronous-type semiconductor memory device. More specifically, the present invention is related to a circuit for adjusting a delay amount of a DLL (Delay Locked Loop) for generating an internal clock signal synchronized in phase with an external clock signal by delaying the external clock signal.

2. Description of the Background Art

A clock synchronous semiconductor memory device for transferring data/signal in synchronization with a clock signal is widely used. In the clock synchronous semiconductor memory device, a skew of a signal/data is required to be considered only with respect to the clock signal, and it is unnecessary to consider a skew among signals, so that an internal operation start timing can be advanced. For example, data is transferred synchronously with a clock signal as a system clock, high-speed data transfer can be achieved and a bandwidth of data transfer can be widened.

As a clock synchronous semiconductor memory device, a DDR SDRAM (Double Data Rate Synchronous Dynamic Random Access Memory) for transferring data synchronously with the rising and falling edges of a clock signal is known.

FIG. 23 is a diagram showing data outputting timings of the DDR SDRAM. As shown in FIG. 23, output data Q0 to Q3 is successively outputted synchronously with the rising and falling edges of an external clock signal CLK. It is determined to output data DQ synchronously with the rising and falling edges of external clock signal CLK as a general standard of output timings of a DDR-SDRAM.

In the case of outputting data by using external clock signal CLK as a trigger, due to delay in a clock input buffer for generating an internal clock and a data output buffer for outputting data, output data is delayed with respect to external clock signal CLK, so that the general standard of data output cannot be satisfied.

Therefore, usually in a DDR-SDRAM, in order to generate a clock signal used for data output, a DLL (Delay Locked Loop) circuit is provided internally. The DLL circuit delays external clock signal CLK by using fixed delay and variable delay internally, thereby generating clock signals CLKP and CLKN for data output each leading in phase relative to external clock signal CLK.

FIG. 24 is a diagram schematically showing the general configuration of a conventional DLL circuit. In FIG. 24, a DLL circuit 900 is provided with a clock input buffer 890 for generating buffered clock signals BUFCLK and ZBUFCLK by buffering external complementary clock signals CLK and ZCLK.

DLL circuit 900 includes: an internal clock generating circuit 902 for generating internal clock signals CLKP and CLKN by delaying buffered clock signals BUFCLK and ZBUFCLK, respectively; a phase difference detecting circuit 904 for detecting a phase difference between internal clock signal CLKP and buffered clock signal BUFCLK and generating signals UP and DWN indicative of a detection result; and a phase control circuit 906 for controlling a delay amount of internal clock generating circuit 902 in accordance with phase detection signals UP and DWN from phase difference detecting circuit 904.

Internal clock signal CLKP for data output is fed back, the phase of internal clock signal CLKP is compared with the phase of buffered clock signal BUFCLK in phase difference detecting circuit 904, and a delay amount in internal clock generating circuit 902 is so adjusted as to minimize the phase difference. By adjusting the phase of internal clock signal CLKP for data output in consideration of delays in clock input buffer 890 and the data output buffer, the phase of external clock CLK and the phase of the data output can be made coincident with each other.

FIG. 25 is a diagram showing more specifically a configuration of DLL circuit 900 in FIG. 24. In FIG. 25, phase difference detecting circuit 904 includes: a replica buffer 34 for delaying internal clock signal CLKP by a predetermined time; and a phase detector 35 for detecting the phase difference between a feedback clock signal FBCLK outputted from replica buffer 34 and buffered clock signal BUFCLK. Replica buffer 34 is provided to compensate for the delays in clock input buffer 890 and the data output buffer shown in FIG. 24. Usually, clock input buffer 890 is constructed by a differential amplifier. In the case of detecting an intersecting portion of complementary external clock signals CLK and ZCLK and generating buffered clock signals BUFCLK and ZBUFCLK, the delay in clock input buffer 890 is neglected.

Phase detector 35 outputs phase detection result indicating signals UP and DWN in accordance with a result of phase comparison between feedback clock signal FBCLK and buffered clock signal BUFCLK. If feedback clock signal FBCLK leads in phase the buffered clock signal BUFCLK, up instruction signal UP is set to the H level in order to increase the delay amount of internal clock signals CLKP and CLKN. On the contrary, where feedback clock signal FBCLK lags in phase behind buffered clock signal BUFCLK, in order to advance the phases of internal clock signals CLKP and CLKN, down instruction signal DWN is set to the H level.

The delay amount of internal clock signal CLKP is increased by up instruction signal UP and is decreased by down instruction signal DWN.

Phase control circuit 906 includes: a counting circuit 307 for performing a counting operation in accordance with output signals UP and DWN of phase detector 35; and a count control circuit 41 for controlling the minimum count value of counting circuit 37 upon power up or system reset. According to a count A[N:0] of counting circuit 37, the delay amount of each of internal clock signals CLKP and CLKN is set.

Internal clock generating circuit 902 includes: a variable delay line 32 for generating internal clock signal CLKP by delaying buffered clock signal BUFCLK; and a variable delay line 33 for generating internal clock signal CLKN by delaying buffered clock signal ZBUFCLK. Count A[N:0] of counting circuit 37 is commonly supplied to variable delay lines 32 and 33. Count circuit 37 is a bidirectional counter. The count of counting circuit 37 is increased when up instruction signal UP outputted from phase detector 35 is activated, and is decreased when down instruction signal DWN outputted from phase detector 35 is activated. The delay amount of each of variable delay lines 32 and 33 is set by the count of counting circuit 37. When count A[N:0] increases, the delay amounts of variable delay lines 32 and 33 increase.

Count control circuit 41 controls the counting operation of counting circuit 37 by an enable signal EN. When enable signal EN is set to the H level, counting circuit 37 performs the counting operation. When enable signal EN is set to the L level, the counting operation is stopped. For example, in a power down mode or the like, the counting operation of counting circuit 37 is stopped to reduce current consumption.

FIGS. 26A and 26B are diagrams illustrating the phase detecting operation of phase detector 35 shown in FIG. 25. Phase detector 35 generates output signals UP and DWN so that the phase of feedback clock signal FBCLK and the phase of buffered clock signal BUFCLK coincide with each other. Signals UP and DWN are signals complementary to each other. The phase detection timing is the rising edge of buffered clock signal BUFCLK.

In FIG. 26A, if feedback clock signal FBCLK is at the L level at the rising edge of buffered clock signal BUFCLK, the phase of feedback clock signal FBCLK has to be advanced. In this case, therefore, down instruction signal DWN from phase detector 35 is set to the H level, and the delay amount of feedback clock signal FBCLK is reduced.

As shown in FIG. 26B, when feedback clock signal FBCLK is at the H level at the rising edge of buffered clock signal BUFCLK, the phase of feedback clock signal FBCLK is advanced relative to buffered clock signal BUFCLK. In this case, therefore, it is necessary to delay feedback clock signal FBCLK. By setting the up instruction signal UP to the H level, the delay amount of feedback clock signal FBCLK is increased.

FIGS. 27 and 28 are diagrams representing the operation of DLL circuit 900 shown in FIG. 25. Referring to FIGS. 27 and 28, a phase adjusting operation of DLL circuit 900 will be briefly described.

In FIG. 27, buffered clock signal BUFCLK rises to H level at time t1. Variable delay lines 32 and 33 delay buffered clock signals BUFCLK and ZBUFCLK, respectively, in accordance with the count from counting circuit 27.

In FIG. 27, internal clock signal CLKP rises to H level at time t2. Replica buffer 34 delays internal clock signal CLKP for data output by a predetermined time (predetermined fixed time). Therefore, feedback clock signal FBCLK rises to H level at time t3. In this case, the rising edge of feedback clock signal FBCLK occurs at a timing faster than the rising edge of buffered clock signal BUFCLK. Consequently, phase detector 35 sets the up instruction signal UP to the H level in order to increase the delay amount of internal clock signal CLKP.

Specifically, in DLL circuit 900, by delaying buffered clock signals BUFCLK and ZBUFCLK, internal clock signals CLKP and CLKN are generated. Feedback clock signal FBCLK is delayed by replica buffer 34 by fixed time. Therefore, the data output timing can be set to a timing faster than the rising edge of external clock signal CLK, and data can be outputted synchronously with the edge of external clock signal CLK.

By the phase adjusting operation, in FIG. 28, the rising edge of feedback clock signal FBCLK and that of buffered clock signal BUFCLK are made coincident with each other. In this case, at time t2 in FIG. 28, internal clock signal CLKP for data output goes high. Synchronously with internal clock CLKP, data output is executed. The delay time of replica buffer 34 is determined in consideration of delay time of data propagation in the data output buffer. Therefore, by outputting data synchronously with data outputting internal clock signals CLKP and CLKN at timings shown in FIG. 28, data is transferred via the output buffer between time t2 and t3, and the output data changes at time t3. Since clock signal CLKN is also generated similarly by delaying buffered clock signal ZBUFCLK, data can be outputted at the falling edge of external clock signal CLK. Thus, data can be outputted synchronously with the rising and falling edges of external clock signal CLK.

The number of cycles required until the phase of buffered clock signal BUFCLK and that of feedback clock signal FBCLK coincide with each other takes the maximum when after power-on reset, clock signals BUFCLK and FBCLK are out of phase by 180° from each other, for example.

Specifically, as shown in FIG. 29, when buffered clock signal BUFCLK and feedback clock signal FBCLK are out of phase from each other by 180° C., the phase of feedback clock signal FBCLK is determined to be either the H or L level at the rising edge of buffered clock signal BUFCLK. Each of clock signals BUFCLK and FBCLK is a clock signal of which duty is 50%, in which the H level period and the L level period are equal to each other. In this case, according to a result of the determination, when the phase of feedback clock signal FBCLK changes, in the subsequent cycles, the signal UP or DWN is successively generated until the phases coincide with each other.

Assuming that the cycle of external clock signal CLK, that is, buffered clock signal BUFCLK is TCK(ns) and a delay amount of feedback clock signal FBCLK per cycle is Δt(ns), in the case of the 180° out of phase, the number of cycles necessary to make the phases coincide with each other is given by (TCK/2)/Δt.

When it is assumed that the maximum value TCKmax of the clock cycle determined in specifications compliant with JEDEC (Joint Electron Device Engineering Council) is 15 ns and the delay amount Δt of one cycle is 0.04 ns, 187 cycles are necessary for the phase coincidence. On the other hand, the specification value of the maximum cycle number required for the DLL circuit to make the phases coincide with each other since the power-on resetting is 200. Therefore, in the case of comparing the phases with the duty ratio of feedback clock signal FBCLK maintained at 50%, the margin becomes extremely small with respect to the specification value. It would be possible that data cannot be outputted synchronously with the external clock signal stably at a faster timing after the power-on resetting.

In order to avoid the problem of synchronization or locking of the DLL circuit, a technique of waveform-shaping the data outputting clock signal into a self timing pulse having a predetermined pulse width of, for example, about 2 ns and feeding back the self timing pulse for phase comparison is used.

FIG. 30 is a diagram schematically showing the configuration of DLL circuit 900 including a self timing pulse generating circuit. In FIG. 30, in internal clock generating circuit 902, one-shot pulse generating circuits 39 and 40 are provided in output stages of variable delay lines 32 and 33, respectively. From one-shot pulse generating circuits 39 and 40, internal clock signals CLKP and CLKN for data output are generated, respectively. Internal clock signal CLKP outputted from one-shot pulse generating circuit 39 is supplied to replica buffer 34 in phase difference detecting circuit 904.

The other configuration of the DLL circuit shown in FIG. 30 is the same as that of the DLL circuit shown in FIG. 25, the same reference numerals are designated to corresponding parts and their detailed description will not be repeated.

One-shot pulse generating circuit 39 generates a one-shot pulse signal set to L level for a predetermined time in response to the rising of the output clock signal CLKPF of variable delay line 32 as shown in FIG. 31. The output pulse of one-shot pulse generating circuit 39 is fed back as feedback clock signal FBCLK to phase detector 35 via replica buffer 34.

Count control circuit 41 sets predetermined bits in an enable signal EN[N:0] to the L level until down instruction signal DWN is generated from phase detector 35 and increases the count step of counting circuit 37 to be larger than the minimum value. When down instruction signal DWN is generated, count control circuit 41 sets all bits of enable signal EN[N:0] to the H level. Accordingly, the delay change amount per one cycle is set to the minimum value when the delay amount decreases.

FIG. 32 is a diagram schematically showing the phase relation of feedback clock signal FBCLK and buffered clock signal BUFCLK. Feedback clock signal FBCLK has an L-level period of a predetermined period (for example, 2 ns) by one-shoe pulse generating circuit 39.

Assuming now that the falling edge of feedback clock signal FBCLK is generated substantially at the same timing as the rising edge of buffered clock signal BUFCLK. When phase detector 35 determines that feedback clock signal FBCLK is at the H level at the rising edge of buffered clock signal BUFCLK, phase detector 35 sets the up instruction signal UP to the H level to increase a delay amount. In this case, therefore, the feedback clock signal FBCLK is required to have the phase thereof shifted by the H level period thereof. On the other hand, when it is determined that feedback clock signal FBCLK is at the L level at the rising edge of buffered clock signal BUFCLK, down instruction signal DWN is set to the H level and a delay amount is decreased. In this case, therefore, the delay amount is adjusted only by the L level period of feedback clock signal FBCLK.

The L level period of feedback clock signal FBCLK is short as, for example, 2 ns and the H level period is long. Consequently, in the beginning of the phase adjustment, when feedback clock signal FBCLK is at the H level at the rising edge of buffered clock signal FUBCLK, a delay change amount per cycle is set to, for example, 8 Δt. When feedback clock signal FBCLK goes low for the first time and down instruction signal DWN responsively goes high after resetting of DLL circuit 900, the delay change amount of a delay cycle of each of variable delay lines 32 and 33 is reduced to Δt. In this case, when the cycle of buffered clock signal BUFCLK is TCK and the L level period of feedback clock signal FBCLK is 2 ns, the maximum number of cycles until the phases coincide with each other is expressed by the following expression.

$$(TCK-2)/(8 \Delta t)+2/\Delta t$$

Where the cycle TCK is 15 ns and the minimum delay change amount Δt is 0.04 ns, the maximum number of cycles required for the phase coincidence is about 90 cycles. The margin can be largely increased as compared with 200 cycles defined in the specification value of JEDEC.

FIG. 33 is a diagram schematically showing the configuration of count control circuit 41 shown in FIG. 30. In FIG. 33, count control circuit 41 includes an interconnection 41a for fixing enable signals EN[N:3] to the H level (power supply voltage VDD level) and a set/reset flip flop 41b which is reset in response to a power-on detection signal (power-on reset signal) ZPOR and is set in response to activation of down instruction signal DWN to generate enable signals EN[2:0].

In the configuration of count control circuit 41 shown in FIG. 33, after power on, all of enable signals EN[N:3] are fixed to the H level. On the other hand, set/reset flip flop 41b is reset by power-on detection signal ZPOR after power up to set enable signals EN[2:0] to the L level. When down instruction signal DWN is set to the H level, set/reset flip flop 41b is set, thereby setting enable signals EN[2:0] to the H level.

FIG. 34 is a diagram schematically showing the configuration of counting circuit 37 shown in FIG. 30. In FIG. 34, counting circuit 37 includes (N+1) unit counters CNT0 to CNTN. From unit counters CNT0 to CNTN, delay setting signals (delay stage address signals) A[0] to A[N] are generated. To unit counters CNT0 to CNTN, up instruction signal UP and down instruction signal DWN are supplied. Enable signals EN[0] to EN[N] are supplied to unit counters CNT0 to CNTN, respectively. Unit counters CNT0 to CNTN execute counting operation when corresponding enable signals EN[0] to EN[N] are set to the H level.

Therefore, since enable signals EN[2:0] are at the L level until down instruction signal DWN is activated after power on, unit counters CNT0 to CNT2 do not perform the counting operation, and delay stage address signals A[0] to A[2] are maintained at the initial values. Unit counters CNT3 to CNTN perform the counting operation in accordance with up instruction signal UP and increase their count values.

By delay stage address signal bits A[0:N], the delay amounts of variable delay lines 32 and 33 shown in FIG. 30 are set. The counting operation is performed by the unit counters of and upper than counter CNT3, and the count bits of and upper than bit A[3] (delay stage address signals) change. Therefore, delay stage address signals A[N:0] indicate the delay amount of the variable delay circuit in a binary number notation, and the delay amount is changed in a unit of 8 Δt. The configuration of variable delay lines 32 and 33 will be described later. Delay stages having delay amounts according to weights of counter bits A[0] to A[N] are cascaded, a corresponding delay stage is selectively bypassed according to the values of count bits A[0] to A[N], and a delay amount of the variable delay line is set.

When feedback clock signal FBCLK is set to the H level at the rising edge of buffered clock signal BUFCLK and up instruction signal UP is set to the H level, the counting operation is performed by count bits A[3:N], and a delay amount is increased in a step of 8 Δt. When down instruction signal DWN is set to the H level, enable signal EN[2:0] is set to the H level, and the counting operation is performed by using count bits A[0] to A[N] of counting circuit 37. In this case, therefore, the delay amount of variable delay lines 32 and 33 is changed in a step of Δt.

When the phase of buffered clock signal BUFCLK and that of feedback clock signal FBCLK become close to each other, there is the possibility that an output signal of phase detector 35 enters a metastable state. When the output signal of phase detector 35 enters the metastable state, count bits A[N:0] of counting circuit 37 also enter the metastable state, and the number of delay stages used in variable delay lines 32 and 33 becomes undetermined. Therefore, internal clock signals CLKP and CLKN also become indefinite and there is the possibility that the data output timing cannot be synchronized with external clock signal CLK.

FIG. 35 is a diagram showing a further configuration of a conventional DLL circuit. In DLL circuit 900 shown in FIG.

35, to reduce the probability that an influence of the metastable state of an output signal of phase detector 35 is exerted on the number of delay stages used in variable delay lines 32 and 33, an output signal of phase detector 35 is transmitted to counting circuit 37 via a shifting circuit 42. An output signal of phase detector 35 is transmitted to counting circuit 37 via shifting circuit 42. Therefore, there is time lag by the shift circuit 42 from when feedback clock signal FBCLK falls for the first time at the rising edge of buffered clock signal BUFCLK and until when the delay is actually is decreased subsequently. In the period of the time lag, where the number of stages of shifting circuit 42 is M, a delay amount erroneously increase by M×(8 Δt). For example, when a variable delay amount per cycle immediately after feedback clock signal FBCLK falls to L level for the first time at the rising edge of buffered clock signal BUFCLK is Δt and the number of shifting stages of shifting circuit 42 is three, 24 cycles are necessary to compensate for the excessive increase in the delay amount.

To prevent excessive control by such a time lag, count control circuit 41 is provided with the function of compensating for the excessive increase in the delay amount.

FIG. 36 is a diagram showing an example of the configuration of count control circuit 41. In FIG. 36, count control circuit 41 includes: an inverter 41c receiving down instruction signal DWN; an NOR circuit 41d receiving enable signal EN and an output signal of inverter 41c; an AND circuit 41e receiving buffered clock signal BUFCLK and an output signal of NOR circuit 41d; a shifter 41f for performing an internal transferring operation when a signal supplied to an input IN is at the H level and outputting an internal signal to an output OUT when the signal supplied to input IN is at the L level; a shifter 41g receiving an output signal of shifter 41f by input IN; and an AND circuit 41h receiving output signals of shifters 41f and 41g and generating enable signals EN[2:0].

AND circuit 41h outputs a 1-bit signal, and enable signals EN[2:0] are commonly controlled by AND circuit 41h. To a reset input RST in each of shifters 41f and 41g, a reset signal RESET is applied. Reset signal REST is set to the H level at the time of power-on reset or at the time of system reset.

FIG. 37 is a diagram showing an example of the configuration of shifters 41f and 41g shown in FIG. 36. Since shifters 41f and 41g have the same configuration, the configuration of one shifter is representatively shown in FIG. 37.

In FIG. 37, each of shifters 41f and 41g includes: a reset transistor TR0 for resetting an internal node F0 to the ground voltage level in accordance with a reset signal applied to reset input RST; an inverter IV0 for inverting a signal at internal node F0; a tri-state buffer TB0 activated when a signal applied to input IN is at the L level and transmitting an output signal of inverter IV0 when activated; an inverter latch LT0 for inverting and latching an output signal of tri-state buffer TB0; a tri-state buffer TB1 activated when a signal applied to input IN is at the H level, and inverting and transmitting the latch signal of latch LT0 when activated; an inverter latch LT1 for latching an output signal of tri-state buffer TB1; a tri-state buffer TB2 activated when a signal applied to input IN is at the L level, and inverting the latch signal of latch LT1 for transmission to an output node OUT; and an inverter latch LT3 for latching an output signal of tri-state buffer TB2.

A signal applied to input IN is inverted by an internal inverter, and complementary signals of inputs IN and ZIN are applied as control signals to tri-state buffers TB0 to TB2.

FIG. 38 is a timing chart representing the operation of count control circuit 41 shown in FIGS. 36 and 37. Referring to FIG. 38, the operation of the count control circuit shown in FIGS. 36 and 37 will be described below.

In the initial state, shifters 41f and 41g are set by reset signal RESET applied to reset input RST, and internal node F0 is set to the L level. Since the down instruction signal DWN is at the L level, an output signal of inverter 41c is at the H level and an output signal of NOR circuit 41d is accordingly at the L level. An output signal of AND circuit 41e is at the L level. In shifter 41f, tri-state buffer TB2 at the output stage is in an active state and a signal of the L level is outputted. Similarly, an output signal F002 of shifter 41g is at the L level. In this state, enable signals EN[2:0] are at the L level.

By the shifting operation of shifting circuit 42, even when buffered clock signal BUFCLK is generated during a period in which down instruction signal DWN is at the L level, an output signal of AND circuit 41e is at the L level. In each of shifters 41f and 41g, tri-state buffer TB1 is in an output high impedance state, a transferring operation is not internally performed, and all of enable signals EN[2:0] maintain at the L level.

When down instruction signal DWN rises to the H level by the shifting operation of shifting circuit 42, an output signal of inverter 41c goes low. Accordingly, an output signal of NOR circuit 41d attains the H level. When buffered clock signal BUFCLK goes high, an output signal of AND circuit 41e goes high, tri-state buffer TB1 is activated in shifter 41f, and the L-level signal latched by latch LT0 is transferred to latch LT1. In this state, tri-state buffer TB2 is in an output high impedance state, and a signal F001 from output node OUT maintains the L level.

When buffered clock signal BUFCLK falls to the L level, tri-state buffer TB1 enters an output high impedance state. On the other hand, tri-state buffers TB0 and TB2 are activated, the H-level signal latched by latch LT1 is outputted to output node OUT, and output signal F001 of shifter 41f attains the H level. The L-level signal is transferred to latch LT0 by inverter IV0, and latch LT0 maintains the output signal at the H level.

In shifter 41g, when output signal F001 of shifter 41f rises, the transferring operation is performed internally, and the signal latched by latch LT1 rises to the H level.

In the following cycle, if down instruction signal DWN maintains the H level, shifter 41f performs the internal transferring operation again in response to the rising edge of buffered clock signal BUFCLK, thereby transferring the H-level signal latched by latch LT0 to latch LT1. When buffered clock signal BUFCLK goes low, tri-state buffer TB2 is accordingly activated, and output signal F001 of output node OUT falls to L level.

When output signal F001 of shifter 41f falls to the L level, tri-state buffer TB2 in the final stage of shifter 41g is activated, the H-level signal latched by latch LT1 is transferred to output node OUT, and output signal F002 of output node OUT rises to the H level. Even when output signal F002 of shifter 41g goes high, output signal F001 of shifter 41f remains at the L level, and an output signal of AND circuit 41h is at the L level. Therefore, enable signal EN[2:0] is still maintained at the L level.

Where down instruction signal DWN is set at the H level, the transferring operation is performed again in shifter 41f in response to the rising edge of buffered clock signal BUFCLK. In response to the falling edge of buffered clock signal BUFCLK, output signal F001 of shifter 41f goes high.

In shifter 41g, when output signal F001 of shifter 41f is at the L level, the internal transferring operation is not performed, and the latching state is maintained. Therefore, output signal F002 of shifter 41g is maintained at the H level. When the output signal of shifter 41f rises to the H level, tri-state buffer TB1 is activated in shifter 41g, and the signal latched in latch LT0 is transferred to latch LT1. In this state, however, tri-state buffer TB2 is in the output high impedance state, and the H-level signal latched by latch LT3 is outputted. Therefore, when output signal F001 of shifter 41f goes high, output signal F001 of shifter 41g is at the H level, and an output signal of AND circuit 41h, that is, enable signals EN[2:0] rise to the H level.

When enable signals EN[2:0] go high, the output signal of NOR gate 41d is fixed at the L level, the shifting operation in shifters 41f and 41g is not performed and, hereinafter, enable signals EN[2:0] are maintained at the H level.

Therefore, when down instruction signal DWN is generated three times in total, enable signals EN[2:0] are set to the H level, and the counting of counting circuit 37 is executed by using all bits A[N:O].

Where shifting circuit 42 is constructed by shifters of three stages, the delay amount increases three due to the time lag caused in the shifting operation of shifting circuit 42, the number of delay stages is decreased three times in total, and then the delay change amount per cycle is set to the minimum unit of Δt. Consequently, when shifting circuit 42 is constructed by shifters of N stages, in count control circuit 41, as shifters 41f and 41g, shifters of (N−1) stages are provided. According to output signals of the shifter in the final stage and the shifter in the preceding stage of the final stage, enable signals EN[2:0] are generated.

The shifters of M stages in shifting circuit 42, and the delay change amount per cycle is assumed to be nΔt until the feedback clock signal FBCLK falls to the L level for the first time after resetting of the DLL circuit at the timing of the rising edge of buffered clock signal BUFCLK, and the L level period width of feedback clock signal FBCLK is assumed to be ΔT. Under such assumption, in order to compensate for the excessive delay increase amount, the following inequality has to be satisfied.

$$\Delta T > M \cdot n \Delta t$$

When the inequality is satisfied, the delay amount is decreased by M times for the excessive delay increase of M times, so that no problem occurs. However, if due to variations in processes or the like, the self timing pulse width ΔT of feedback clock signal FBCLK is shortened, there is caused the possibility that the above inequality does not hold. The case where the number of stages of shifters of shifting circuit 42 is three (M=3) will now be considered.

FIG. 39 is a diagram schematically showing the configuration of a DLL circuit in which shifters of three stages are provided in shifting circuit 42. In phase difference detecting circuit 904 shown in FIG. 39, shifters 42ua to 42uc of three stages for transferring an output signal UP0 of phase detector 35 synchronously with buffered clock signal BUFCLK, and shifters 42da to 42dc for transferring an output signal DWN0 of phase detector 35 synchronously with buffered clock signal BUFCLK are provided. Output signals UP and DWN of shifters 42uc and 42dc are applied as an up instruction signal and a down instruction signal, respectively, to counting circuit 37. Down instruction signal DWN is also applied to count control circuit 41.

Each of shifters 42ua to 42uc and shifters 42da to 42dc latches the applied signal in response to buffered clock signal BUFCLK and an output signal of the circuit of the preceding stage and outputs the latched signal synchronously with the falling edge of buffered clock signal BUFCLK. Signals UP and DWN outputted from shifters 42uc and 42dc therefore change synchronously with the falling edge of buffered clock signal BUFCLK.

FIG. 40 is a diagram illustrating the phase adjusting operation of the DLL circuit shown in FIG. 39. A case where the L level period of feedback clock signal FBCLK is delayed to start behind the falling edge of buffered clock signal BUFCLK before the number of delay stages is decreased three times in total will now be considered. A case where the L level period (self timing width) of feedback clock signal FBCLK is Al and smaller than 3×8 Δt will be considered.

In clock cycle number 0, all of output signals UP0 to UP2 of shifters 42ua to 42uc and output signal UP are at the H level. In this state, up instruction signal UP is at the H level, the delay amount of feedback clock signal FBCLK is increased by 8 Δt, and the phase of feedback clock signal FBCLK is delayed.

By the phase adjusting operation, in clock cycle number 1, feedback clock signal FBCLK is set at L level at the rising edge of buffered clock signal BUFCLK. However, up instruction signal UP is at the H level, so that the delay amount of feedback clock signal FBCLK is increased by 8 Δt again. Subsequently, the operation is successively performed until clock cycle number 3.

Therefore, in clock cycle number 4, although feedback clock signal FBCLK is at the H level at the rising edge of buffered clock signal BUFCLK, up instruction signal UP falls to L level for the first time. Consequently, the delay amount of feedback clock signal FBCLK is decreased by 8 Δt.

In the following clock cycle as well, up instruction signal UP is at the L level, so that the delay amount of feedback clock signal FBCLK is decreased by 8 Δt again. In clock cycle number 6, although feedback clock signal FBCLK is at the L level at the rising edge of buffered clock signal BUFCLK, up instruction signal UP from shifter 42uc is at the H level, so that the delay amount is increased again. In this case, output signal UP0 of phase detector 35 falls to the L level (signal DWN0 is at the H level).

Therefore, since feedback clock signal FBCLK is at the H level at the rising edge of buffered clock signal BUFCLK in clock cycle numbers 3 to 5, so that the delay amount is increased over three clock cycles 6 to 8 successively.

When feedback clock signal FBCLK is delayed in clock cycle 6, feedback clock signal FBCLK has the same phase relation as in clock cycle number 5 with respect to buffered clock signal BFCLK, and the phase adjustment is performed beyond the L level period of feedback clock signal FBCLK. That is, the phase adjustment is performed exceeding the L level period, so that the phase compensation is executed excessively.

In clock cycle number 9, since up instruction signal UP goes low in accordance with output signal UP0 of phase detector 35 in clock cycle number 6, the phase delay amount of feedback clock signal FBCLK is decreased by 8 Δt. Since down instruction signal DWN is activated three times in total, the phase adjustment unit in the subsequent cycles are set to Δt.

Up instruction signal UP and down instruction signal DWN are complementary signals so that when up instruction signal UP is at the L level, down instruction signal DWN is at the H level. In this case, therefore, count control circuit 41 sets all of enable signals EN[2:0] to the H level in accordance with the down instruction signal (the L level of up instruction signal UP) of the third time in clock cycle number 9, so that the delay change amount per cycle of clock cycle number 10 changes to the minimum unit of Δt.

From clock cycle number 7, feedback clock signal FBCLK is at the H level at the rising edge of buffered clock signal BUFCLK, so that signal UP0 outputted from phase detector 35 is at the H level from the clock cycle 7. Accordingly, up instruction signal UP outputted from shifter 42uc rises to the H level again from clock cycle number 10.

In clock cycle number 10, the delay amount has to be further increased according to the result of phase detection in clock cycle number 7. Since feedback clock signal FBCLK is at H level at the rising edge of buffered clock signal BUFCLK thereafter, a process of delaying the rising edge of feedback clock signal FBCLK to the next rising edge of buffered clock signal BUFCLK to establish a phase synchronization of buffered clock signal BUFCLK with the rising edge of feedback clock signal FBCLK is performed.

The sum of the L level period and the H level period of feedback clock signal FBCLK is equal to the cycle TCK of buffered clock signal BUFCLK. Therefore, in the delay adjusting operation in clock cycle number 10 and subsequent cycles, the delay amount has to be increased to the next rising edge of buffered clock signal BUFCLK by delay amount Δt of the minimum step.

As described above, when the L level period of the self timing pulse signal is shortened due to variations in processes and other(s) and becomes smaller than the product of the number of shifting stages and the delay change amount, an increase in the delay amount caused by the time lag in the shifting stages cannot be compensated for, and such a problem arises that the number of cycles necessary to lock feedback clock signal FBCLK with buffered clock signal BFCLK significantly increases.

SUMMARY OF THE INVENTION

An object of the present invention is to provide a clock generating circuit capable of synchronizing the phase of an internal clock signal with the phase of an external clock signal at high speed even when variations in process and other (s) generate.

Another object of the present invention is to provide a DLL circuit capable of suppressing an increase in the number of clock cycles necessary to establish the synchronization even when variations in process generate.

A clock generating circuit according to a first aspect of the present invention includes: an internal clock generating circuit for generating an internal clock signal in accordance with an external clock signal; a phase difference detecting circuit for detecting a phase difference between the internal clock signal and the external clock signal; a phase relation adjusting circuit for continuously maintaining a predetermine state for a predetermined number of clock cycles and, after the predetermined number of clock cycles, releasing the maintained predetermined state, when a phase relation between the internal clock signal and the external clock signal becomes the predetermined state,; a phase adjusting circuit for adjusting a phase of the internal clock signal in accordance with an output signal of the phase relation adjusting circuit; and a delay control circuit for setting a phase adjustment step of the phase adjusting circuit to a first delay amount until the number of the clock cycles maintaining the predetermined state of the phase adjusting circuit reaches the predetermined number of cycles and, setting the phase adjustment step of the phase adjusting circuit to a second delay amount smaller than the first delay amount when the number of the clock cycles of the predetermined state reaches the predetermined number of cycles.

A clock generating circuit according to a second aspect of the present invention includes: an internal clock generating circuit for generating an internal clock signal in accordance with an external clock signal; a phase difference detecting circuit for detecting a phase difference between the internal clock signal and the external clock signal; a phase adjusting circuit for adjusting a phase difference between the internal clock signal and the external clock signal in accordance with an output signal of the phase difference detecting circuit; and a delay control circuit for adjusting a phase adjustment step of the phase adjusting circuit in accordance with the output signal of the phase difference detecting circuit. The delay control circuit increases the phase adjustment step from a first value to a second value for a predetermined cycle period in response to a predetermined state instruction of an output signal of the phase difference detecting circuit and sets the phase adjustment step to a minimum value which is smaller than the first value in cycles after the predetermined period of the cycles.

A clock generating circuit according to a third aspect of the present invention includes: an internal clock generating circuit for generating an internal clock signal in accordance with an external clock signal; a phase difference detecting circuit for detecting a phase difference between the internal clock signal and the external clock signal; a phase adjusting circuit for adjusting a phase difference between the internal clock signal and the external clock signal in accordance with an output signal of the phase difference detecting circuit; and a delay control circuit for adjusting a phase adjustment step of the phase adjusting circuit in accordance with an output signal of the phase difference detecting circuit. The delay control circuit initializes the phase adjustment step to a first value larger than a minimum value and sets the phase adjustment step to the minimum value in response to release of the predetermined state of the output signal of the phase difference detecting circuit.

When the phase adjusting circuit is in a predetermined state, the predetermined state is continuously maintained for the predetermined number of clock cycles and the phase adjustment step is increased during such period, thereby enabling a delay amount which is excessively adjusted to the delay side to be compensated for with reliability.

By increasing the phase adjustment step when the predetermined state is detected in the phase difference detecting circuit, the delay change amount can be increased only in the predetermined state, and the delay amount which is excessively adjusted in the opposite direction can be compensated for with reliability.

By increasing the phase adjustment step in response to the predetermined state of the phases of the internal and external clock signals and setting the phase adjustment step to the minimum value in response to cancellation of the predetermined state, after reliably compensating for the delay amount excessively changed, the delay amount adjustment can be performed in a unit of the minimum delay amount adjustment step. Thus, the phases of external and internal clock signals can be synchronized with each other at high speed. Even when a process parameter and other (s) vary, the internal clock signal can be locked with the external clock signal with reliability at high speed after power is on.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
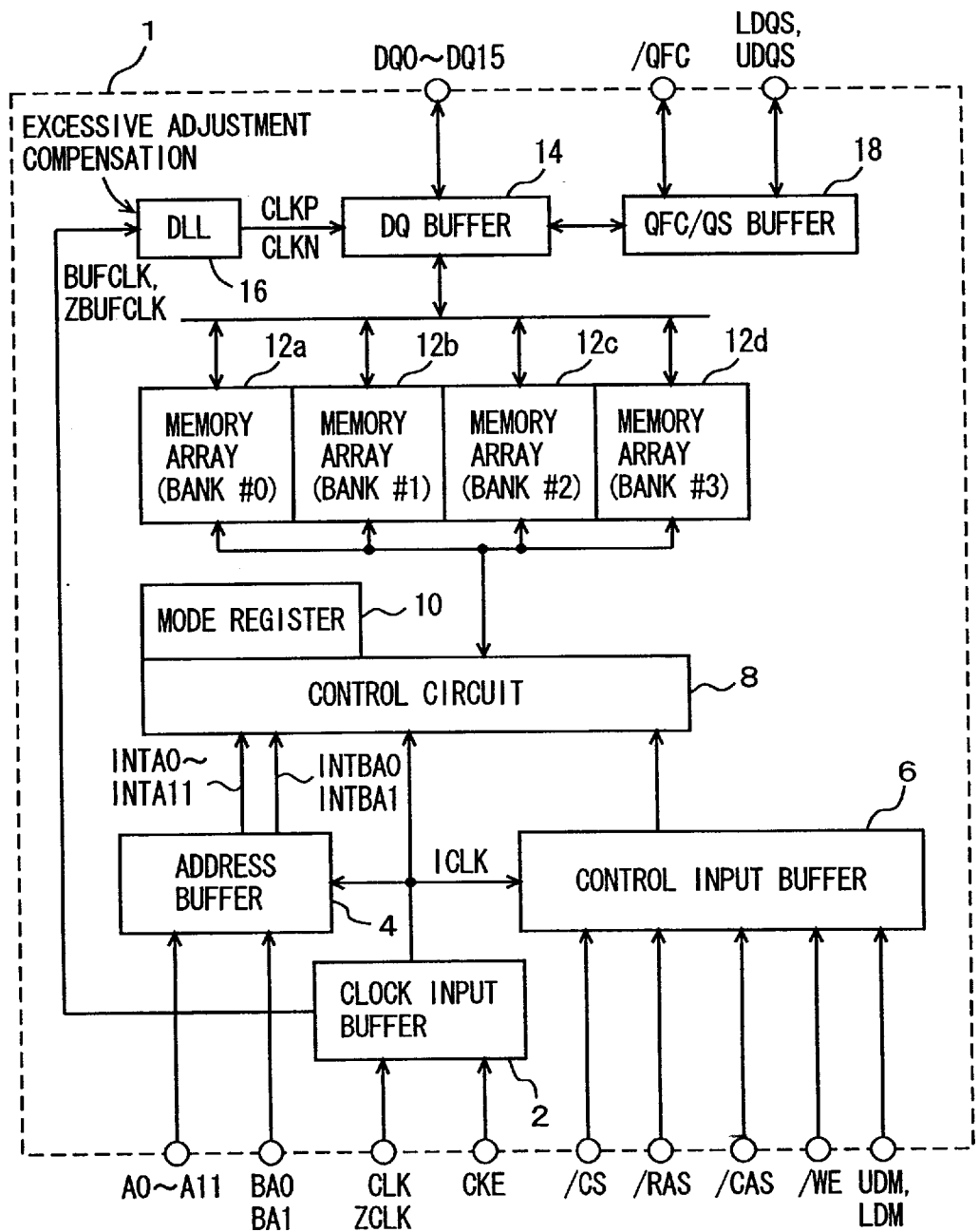
FIG. 1 is a diagram schematically showing the general configuration of a clock synchronous type semiconductor memory device according to the present invention.

FIG. 1 is a diagram schematically showing the general configuration of a semiconductor memory device including a DLL circuit according to the present invention. A semiconductor memory device 1 includes: an address buffer 4 for receiving address signal bits A0 to A11 and bank address signal bits BA0 and BA1 externally and generating internal address signal bits INTA0 to INTA11 and INTBA0 and INTBA1; a clock input buffer 2 receiving complementary external clock signals CLK and ZCLK and a clock enable signal CKE and generating an internal clock signal ICLK; a control input buffer 6 for taking in a chip select signal /CS, a row address strobe signal /RAS, a column address strobe signal /CAS, a write enable signal /WE, and input/output data mask signals UDM and LDM on the basis of internal clock signal ICLK; a control circuit 8 receiving internal clock signal ICLK, internal address signal bits INTA0 to INTA11, INTBA0 and INTBA1 and an output signal of control input buffer 6 and performing operation controls on the whole semiconductor memory device; and a mode register 10 for holding data indicative of an operation mode of the semiconductor memory device by an instruction of control circuit 8 in accordance with an output signal of control input buffer 6.

Address buffer 4 and control input buffer 6 take in the signals applied synchronously with internal clock signal ICLK and generate internal signals. Input/output data mask signals UDM and LDM instruct whether writing/reading of upper-byte data and lower-byte data to be masked or not.

Control circuit 8 determines the designated operation on the basis of the internal control signal applied from control input buffer 6 synchronously with internal clock signal ICLK and generates a necessary internal operation control signal in accordance with the determined operation mode. When chip select signal /CS is at the L level at the rising edge of internal clock signal ICLK, semiconductor memory device 1 is set in a selected state, an external supplied operation mode instruction is determined to be valid, and the designated operation is executed. The operation mode is designated by a combination of logic states of row address strobe signal /RAS, column address strobe signal /CAS, write enable signal /WE, and a predetermined address signal bit at a rising edge of internal clock signal ICLK.

Mode register 10 holds data such as a column latency and burst length of semiconductor memory device 1. Column latency indicates the number of the clock cycles required for externally outputting valid data from supply of data read command. Burst data indicates the number of data successively accessed externally when a read/write command is supplied once.

Semiconductor memory device 1 further includes a DQ buffer 14 for transmitting/receiving data bits DQ0 to DQ15 to/from an external data bus, and memory arrays 12a to 12d for storing data. Memory arrays 12a to 12d construct banks #0 to #3, respectively, each of which can be driven to a selected state independently of others. By bank address signals BA0 and BA1, one bank is designated. An operation mode designated by a command constructed by control signals /RAS, /CAS, and /WE applied externally is executed on the designated bank.

Semiconductor memory device 1 further includes: a DLL circuit 16 receiving buffered clock signals BUFCLK and ZBUFCLK from clock input buffer 2 and generating internal cock signals CLKP and CLKN for data output; and a QFC/QS buffer 18 for inputting/outputting a bus isolation control signal /QFC and a data strobe signal QS. When semiconductor memory device 1 is accessed for writing/reading data, bus isolation control signal /QFC can be used as a control signal for isolating an external data bus from other devices. When another device connected to the external data bus to which the semiconductor memory device is connected uses the external data bus, bus isolation control signal /QFC is used to set semiconductor memory device 1 into an output high impedance state for isolation from the external bus.

Data strobe signals LDQS and UBQS determine strobe timigs of lower-byte data DQ0 to DQ7 and upper-byte data DQ8 to DQ15. When data is written to semiconductor memory device 1, data strobe signals LDQS and UDQS are supplied from an external controller synchronously with the external clock signal. DQ buffer 14 latches external data DQ0 to DQ 15 in accordance with a strobe signal supplied from QFC/QS buffer 18.

When semiconductor memory device 1 outputs data, QFC/QS buffer 18 changes data strobe signals LDQS and UDQS in conformity with data output timings in DQ buffer 14. The external controller receives data DQ0 to DQ15 transferred from semiconductor memory device 1 synchronously with data strobe signals LDQS and UDQS.

In semiconductor memory device 1 shown in FIG. 1, buffered clock signals BUFCLK and ZBUFCLK synchronized with external clock signals CLK and ZCLK are supplied to DLL circuit 16. DLL circuit 16, whose configuration will be described later in detail, includes a self timing pulse generating circuit and has the function of compensating for excessive phase adjustment if the phase adjustment is performed excessively after the L level period of the self timing pulse after power up or upon the system reset.

Figure 2:
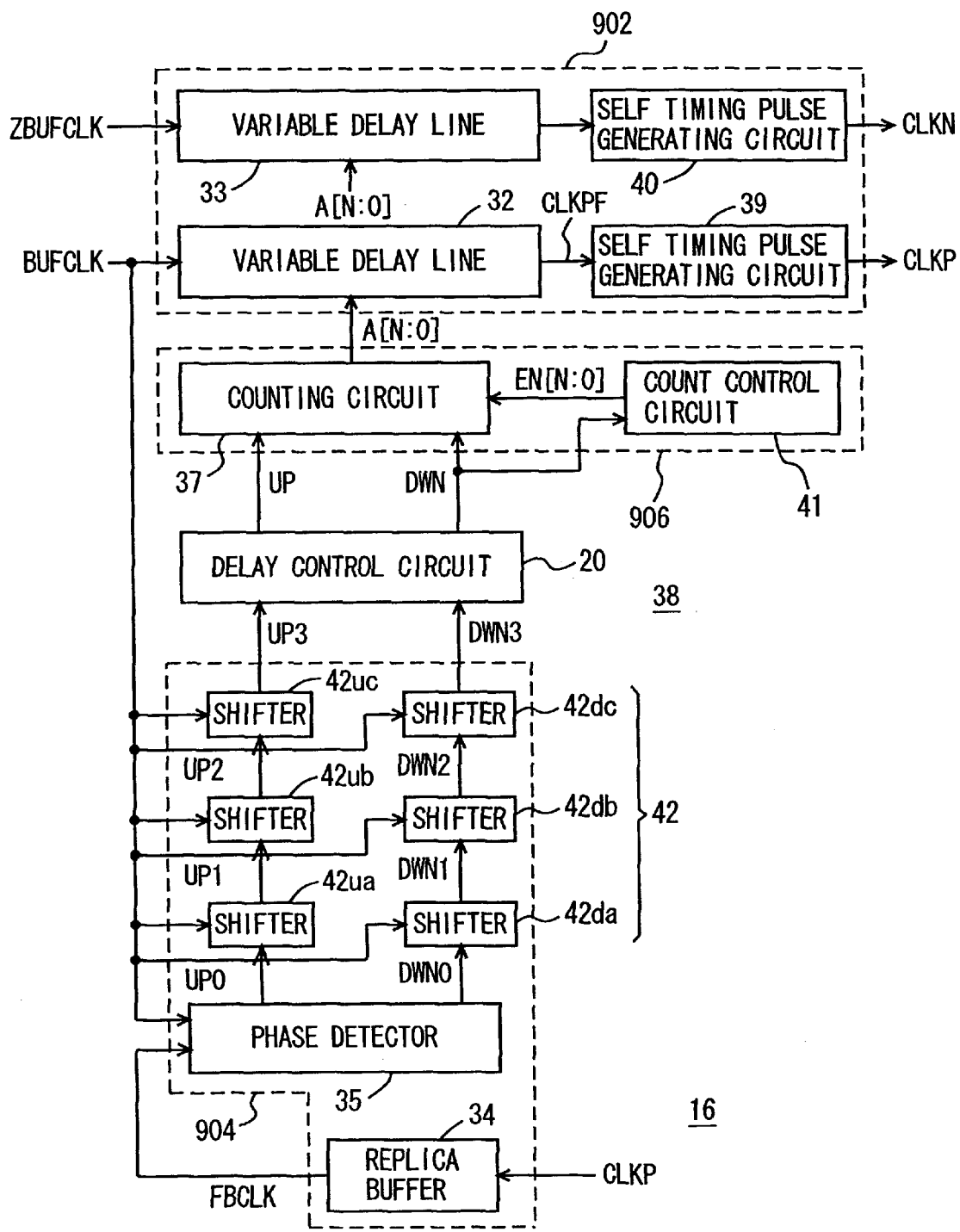
FIG. 2 is a diagram schematically showing the configuration of a DLL circuit shown in FIG. 1.

FIG. 2 is a diagram schematically showing the configuration of DLL circuit 16 shown in FIG. 1. DLL circuit 16 includes: an internal clock generating circuit 902 for generating internal clock signals CLKP and CLKN for data output in accordance with buffered clock signals BUFCLK and ZBUFCLK; and a phase comparator 38 for generating a feedback clock signal FBCLK in accordance with internal clock signal CLKP, comparing phases of feedback clock signal FBCLK and buffered clock signal BUFCLK, and outputting a delay stage address signal A[N:0] in accordance with a result of comparison.

Internal clock generating circuit 902 includes: a variable delay line 32 having a delay amount set according to delay stage address signal A[N:0] from phase comparator 38 and delaying buffered clock signal BUFCLK; a self timing pulse generating circuit 39 for generating a one-shot pulse signal in response to the rising edge of output clock signal CLKPF of variable delay line 32 and generating clock signal CLKP for data output; a variable delay line 33 having a delay amount set according to delay stage address signal A[N:0] outputted from phase comparator 38 and delaying buffered clock signal ZBUFCLK; and a self timing pulse generating circuit 40 for generating a one-shot pulse signal in response to the rising edge of an output clock signal of variable delay line 33, to generate internal clock signal CLKN for data output.

Buffered clock signals BUFCLK and ZBUFCLK are generated by detecting, for example, the crossing point of external clock signals CLK and ZCLK in clock input buffer 2.

Phase comparator 38 includes: a phase difference detecting circuit 904 for detecting a phase difference between internal clock signal CLKP and buffered clock signal BUFCLK; a delay control circuit 20 for generating up instruction signal UP and down instruction signal DWN in accordance with output signals UP3 and DWN3 of phase difference detecting circuit 904; and a phase control circuit 906 for generating delay stage address signal A[N:0] in accordance with output signals UP and DWN of delay control circuit 20.

Phase difference detecting circuit 904 includes: a replica buffer 34 for generating feedback clock signal FBCLK by delaying internal clock signal CLKP; a phase detector 35 for detecting a phase difference between feedback clock signal FBCLK from replica buffer 34 and buffered clock signal BUFCLK; and a shifting circuit 42 for transferring output signals UP0 and DWN0 of phase detector 35 synchronously with buffered clock signal BUFCLK.

Replica buffer 34 generates feedback clock signal FBCLK by delaying internal clock signal CLKP by the same time period as the delay time in DQ buffer 14 in order to compensate for data output delay time in DQ buffer 14 shown in FIG. 1.

Phase detector 35 generates phase detection signals UP0 and DWN0 in accordance with a phase difference between feedback clock signal FBCLK and buffered clock signal BUFCLK.

Shifting circuit 42 includes: shifters 42ua to 42uc for transferring phase difference detection signal UP0 of phase detector 35 synchronously with buffered clock signal BUFCLK; and shifters 42da to 42dc for transferring output signal WDN0 of phase detector 35 synchronously with buffered clock signal BUFCLK. Shifting circuit 42 includes shifters of three stages in the first embodiment. Therefore, output signals UP0 and DWN0 of phase detector 35 are delayed by a period of three clock cycles and then, the delayed signals are supplied to delay control circuit 20.

When output signal DWN3 of shifting circuit 42 is activated, delay control circuit 20 sets down instruction signal DWN to the H level for the period of continuous three clock cycles, thereby instructing decrease in the delay amount of internal clock signal CLKP.

Phase control circuit 906 includes: a counting circuit 37 for performing counting operation bidirectionally in accordance with output signals UP and DWN of delay control circuit 20; and a count control circuit 41 for controlling the counting operation of counting circuit 37 in accordance with down instruction signal DWN outputted from delay control circuit 20.

Count control circuit 41 sets enable signals EN[0:2] for controlling lower count bits of counting circuit 37 to the L level during the period in which down instruction signal DWN is at the H level after power up or the system reset and subsequently, sets enable signals EN[0:2] to the H level. The remaining enable signals EN[3:N] are fixed to the H level by power on.

Counting circuit 37 has the states of the respective bits set in accordance with enable signals EN[0:N]. Specifically, when enable signal EN[i] is at the L level, delay address signal bit A[i] is fixed in counting circuit 37 and the counting is not performed with respect to this bit. Therefore, counting circuit 37 performs the counting operation by using count bits A[3:N] while the count bits A[0:2] are fixed to the initial states. In counting circuit 37, the counting operation is performed according to bits A[3:N], so that the phases of internal clock signals CLKP and CLKN are adjusted with delay amount specified by the lowest bit A[3] in the counting operation being a delay step.

Figure 3:
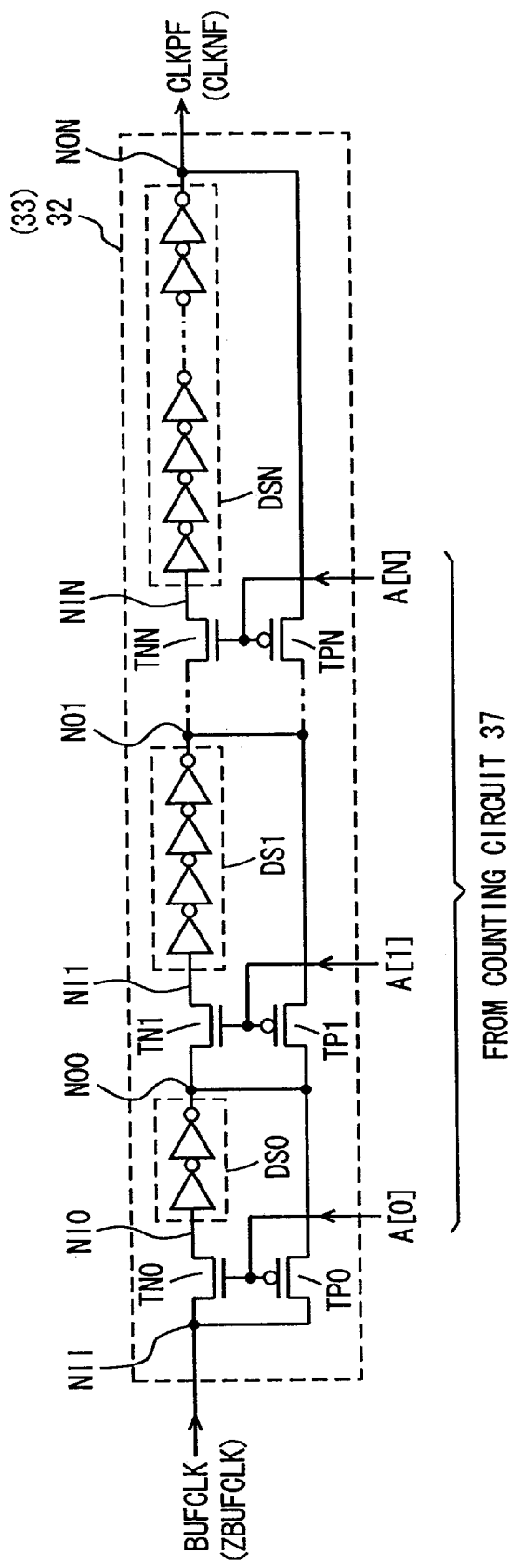
FIG. 3 is a diagram showing the configuration of a variable delay line shown in FIG. 2.

FIG. 3 is a diagram showing an example of the configuration of each of variable delay lines 32 and 33 shown in FIG. 2. Since variable delay lines 32 and 33 have the same configuration, the configuration of variable delay line 32 is shown in FIG. 3, as a representative. With respect to variable delay line 33, its signals are shown within parentheses.

In FIG. 3, variable delay line 32 includes: (N+1) delay stages DS0 to DSN; N-channel MOS transistors (insulated gate field effect transistors) TN0 to TNN provided at the respective inputs of delay stages DS0 to DSN, and connecting output nodes NO0 to NON−1 of delay stages of preceding stages to corresponding input nodes NI0 to NIN when made conductive; and P-channel MOS transistors TP0 to TPN provided in correspondence to delay stages DS0 to DSN, respectively, and bypassing delay stages DS0 to DSN when made conductive.

To MOS transistors TN0 to TNN, delay stage address signal bits A[0] to A[N] from counting circuit 37 are applied. To the gates of MOS transistors TP0 to TPN, similarly, delay stage address signals A[0] to A[N] are applied.

In variable delay line 32, each of delay stages DS0 to DSN is constructed by an even number of stages of cascaded inverters. Delay stage DSj has delay time (2^(j+1)) Δiv. Δiv denotes delay time of the first inverter. The symbol, ^, indicates a power.

Therefore, in variable delay line 32, the minimum delay amount Δt is given by delay stage time 2 Δiv of the inverters of two stages. By setting delay stage address signal bits A[0:N] in accordance with the count of counting circuit 37, delay time represented in binary notation by delay stage address signal bits A[0:N] with delay time Δiv of the inverter of one stage being a weight can be given to buffered clock signal BUFCLK.

For example, when address signal bit A[0] is "1" (H level) and the remaining count bits A[1:N] are "0" (L level), MOS transistors TN1 to TNN and TP0 are set nonconductive and MOS transistors TN0 and TP1 to TPN are set conductive. In this state, therefore, a signal delayed by the delay stage DS0 of one stage is transmitted to output node NON. In this case, delay time of output clock signal CLKPF or CLKNF is given by Δt.

Figure 4:
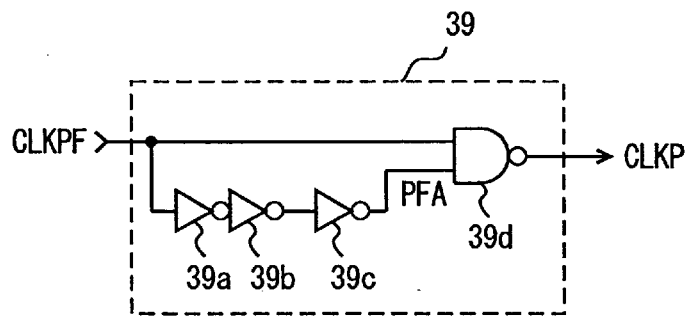
FIG. 4 is a diagram showing an example of the configuration of a self timing pulse generating circuit shown in FIG. 2.

FIG. 4 is a diagram showing an example of the configuration of self timing pulse generating circuit 39 shown in FIG. 2. In FIG. 4, self timing pulse generating circuit 39 includes cascaded inverters 39a to 39c of three stages receiving clock signal CLKPF, and a NAND gate 39 receiving an output signal PFA of inverter 39c and clock signal CLKPF and generating internal clock signal CLKP. By inverters 39a to 39c, an inversion delay circuit is formed.

Figure 5:
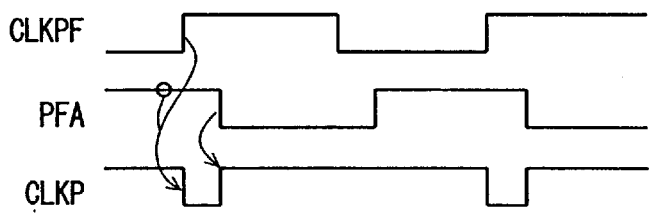
FIG. 5 is a timing chart representing the operation of the circuit shown in FIG. 4.

FIG. 5 is a timing chart representing the operation of self timing pulse generating circuit 39 shown in FIG. 4. Referring to FIG. 5, the operation of self timing pulse generating circuit 39 shown in FIG. 4 will now be described.

When clock signal CLKPF outputted from variable delay line 32 goes high, output signal PFA of inverter 39c is at the H level. Accordingly, clock signal CLKP outputted from NAND circuit 39d falls to the L level. After lapse of delay time of inverters 39a to 39c, output signal PFA of inverter 39c falls to the L level and, accordingly, internal clock signal CLKP from NAND gate 39d rises to the H level.

Self timing pulse generating circuit 39 generates a pulse signal maintained for the delay time of inverters 39a to 39c in response to the rising edge of clock signal CLKPF outputted from variable delay line 32.

Self timing pulse generating circuit 40 for generating internal clock signal CLKN has a configuration similar to that of self timing pulse generating circuit 39 shown in FIG. 4, and generates a one-shot pulse signal of the L level synchronously with the rising edge of the clock signal outputted from variable delay line 33.

Figure 6:
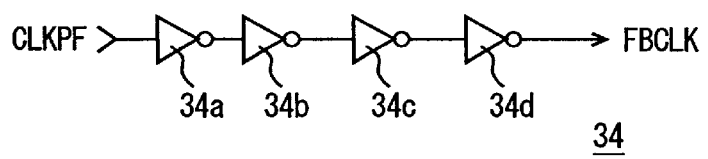
FIG. 6 is a diagram showing an example of the configuration of a replica buffer shown in FIG. 2.

FIG. 6 is a diagram showing an example of the configuration of replica buffer 34 shown in FIG. 2. In FIG. 6, replica buffer 34 includes an even number of cascaded inverters 34a to 34d. In FIG. 6, inverters 34a to 34d of four stages are used in replica buffer 34 as an example. Replica buffer 34 provides feedback clock signal FBCLK with the delay time equal to the delay time of data outputting with respect to the rising edges of internal clock signals CLKP and CLKN in the DQ buffer shown in FIG. 1. It is assumed here that buffered clock signals BUFCLK and ZBUFCLK have no delay time with respect to the external clock signal. In the case of considering the delay time in clock input buffer 2 for generating buffered clock signals BUFCLK and ZBUFCLK, the delay time in the clock input buffer is further added.

Figure 7:
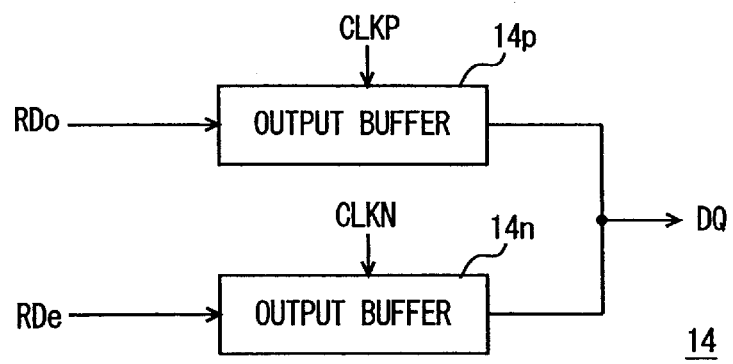
FIG. 7 is a diagram schematically showing the configuration of a DQ buffer shown in FIG. 1.

FIG. 7 is a diagram schematically showing the configuration of a data output part included in DQ buffer 14 shown in FIG. 2. In FIG. 7, the configuration of a portion for outputting 1-bit data is representatively shown. In FIG. 7, DQ buffer 14 includes output buffers 14p and 14n receiving internal read data RD0 and RDe in parallel. Output buffer 14p is activated when internal clock signal CLKP goes high to drive the data output node in accordance with internal read data RD0. Output buffer 14n is activated in response to the rising edge of internal clock signal CLKN to drive output node in accordance with internal read data RDe.

Internal read data RD0 and RDe are read internally in parallel and output buffers 14p and 14n are activated alternately, thereby transferring data synchronously with the rising and falling edges of external clock signal CLK.

Figure 8:
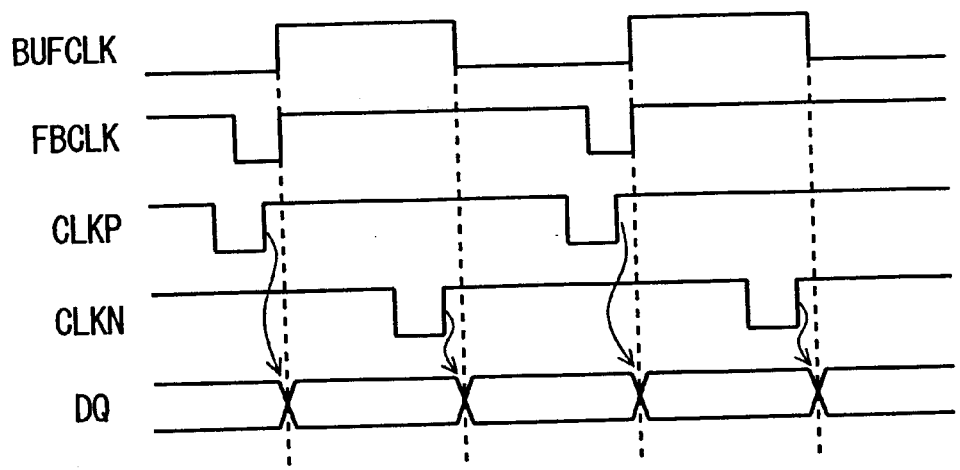
FIG. 8 is a timing chart representing the operation of the DQ buffer shown in FIG. 7.

FIG. 8 is a timing chart representing the operation of the DQ buffer shown in FIG. 7. With reference to FIG. 8, the operation of DQ buffer 14 shown in FIG. 7 will now be briefly described.

In a steady state, the rising edge of feedback clock signal FBCLK is synchronized with the rising edge of buffered clock signal BUFCLK. Output signal CLKP leads in phase feedback clock signal FBCLK, and output buffer 14p is activated synchronously with the rising edge of internal clock signal CLKP to output data externally. In this state, data propagation delay in output buffer 14p is compensated for by replica buffer 34, and data DQ changes synchronously with buffered clock signal BUFCLK, that is, external clock signal CLK.

In contrast, clock signal CLKN changes synchronously with complementary buffered clock signal ZBUFCLK.

Therefore, internal clock signal CLKN goes high at a timing faster than the falling edge of buffered clock signal BUFCLK, and output buffer 14n outputs data synchronously with internal clock signal CLKN. By alternately activating output buffers 14p and 14n, data can be outputted synchronously with the rising and falling edges of buffered clock signal BUFCLK, that is, external clock signal CLK.

In the case of using self timing pulses CLKP and CLKN from the self timing pulse generating circuit directly are to activate output buffers 14p and 14n, a period, in which the H level period of timing pulse CLKP and the H level period of timing pulse CLKN overlap with each other, exists. In this case, a configuration of making output buffers 14p and 14n active only for a predetermined period from the rising edges of internal clock signals CLKP and CLKN, respectively, may be used. Alternatively, such a configuration may be employed that an ANDed signal of internal clock signal CLKP and clock signal CLKPF outputted from variable delay line 32 is supplied to output buffer 14p and an ANDed signal of the clock signal outputted from variable delay line 33 and internal clock signal CLKN to the output buffer 14n as a data output control clock signal.

Figure 9:
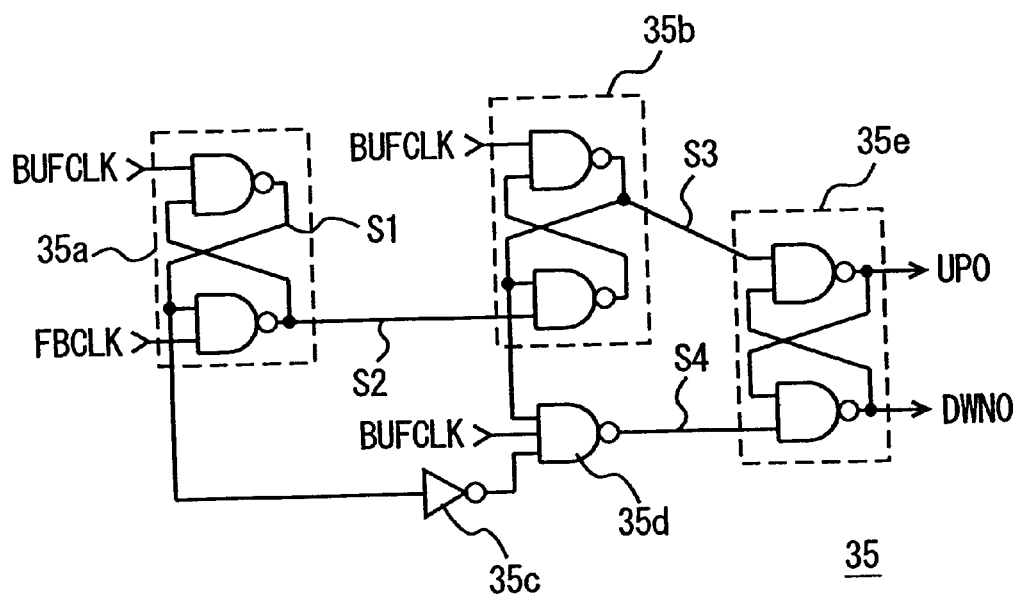
FIG. 9 is a diagram showing an example of the configuration of a phase detector shown in FIG. 2.

FIG. 9 is a diagram showing an example of the configuration of phase detector 35 shown in FIG. 2. In FIG. 9, phase detector 35 includes: a NAND type flip flop 35a receiving buffered clock signal BUFCLK and feedback clock signal FBCLK; a NAND type flip flop 35b receiving buffered clock signal BUFCLK and an output signal S2 of flip flop 35a; an inverter 35c receiving an output signal S1 of flip flop 35a; a NAND gate 35d receiving an output signal of inverter 35c, buffered clock signal BUFCLK, and an output signal S3 of flip flop 35b; and a NAND type flip flop 35e receiving output signal S3 of flip flop 35b and an output signal S4 of NAND gate 35d and generating the up instruction signal UP and the down instruction signal DWN.

Output signal S1 of flip flop 35a is set to the H level when buffered clock signal BUFCLK is at the L level, and output signal S2 of flip flop 35a is set to the H level when feedback clock signal FBCLK is at the L level. When the phase of feedback clock signal FBCLK advances the phase of buffered clock signal BUFCLK, the signal S2 falls to the L level. When the phase of buffered clock signal BUFCLK advances the phase of feedback clock signal FBCLK, the signal S1 is set to the H level.

Output signal S3 of flip flop 35b is set to the H level when buffered clock signal BUFCLK is at the L level. Flip flop 35e sets the up instruction signal UP to the H level when output signal S3 of flip flop 35b is at the L level and sets the down instruction signal DWN to the H level when an output signal of NAND gate 35d is at the L level.

Figure 10:
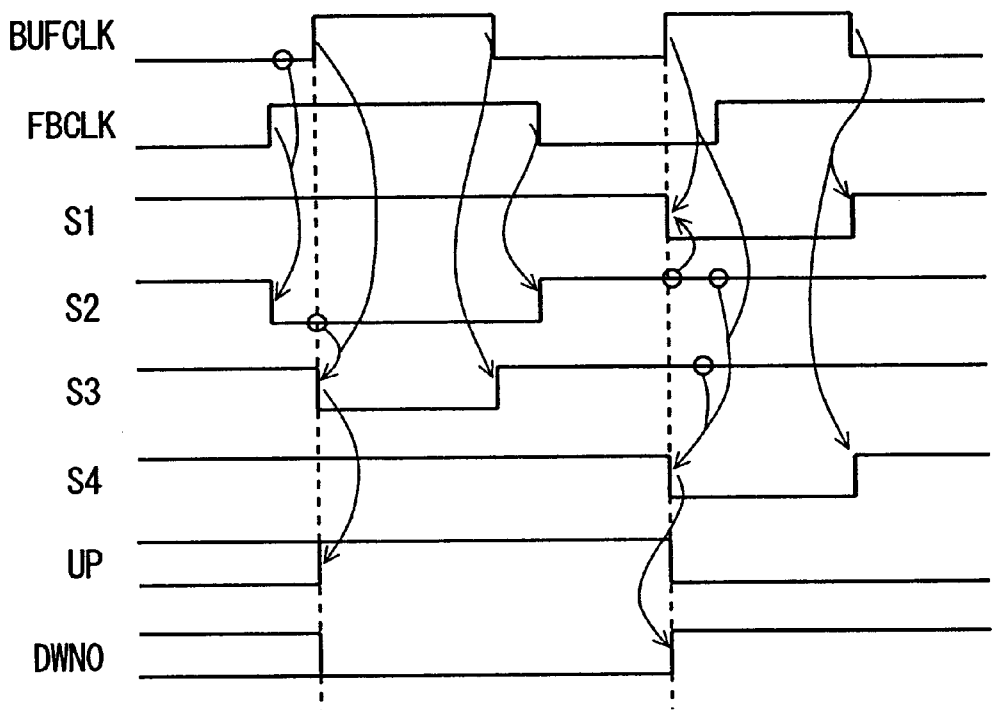
FIG. 10 is a timing chart representing the operation of the phase detector shown in FIG. 9.

FIG. 10 is a timing chart representing the operation of phase detector 35 shown in FIG. 9. Referring to FIG. 10, the operation of phase detector 35 shown in FIG. 9 will be described below.

When buffered clock signal BUFCLK is at the L level, output signal S1 of flip flop 35a is at the H level. During the period in which feedback clock signal FBCLK is at the L level, the output signal S2 of flip flop 35a is at the H level. Output signal S3 of flip flop 35b is also at the H level during the period in which buffered clock signal BUFCLK is at the L level. During the period in which buffered clock signal BUFCLK is at the L level, the output signal S4 of NAND gate 35b is at the H level. Therefore, the output signals UP and DWN of flip flop 35e maintain the state of the immediately preceding cycle.

When feedback clock signal FBCLK rises at a timing faster than the rising edge of buffered clock signal BUFCLK, output signal S2 of flip flop 35a goes low. At this time, buffered clock signal BUFCLK is still at the L level, so that all of the signals S1, S3, and S4 maintain the H level.

When buffered clock signal BUFCLK rises to the H level, output signal S3 of flip flop 35b fall to the L level and accordingly, up instruction signal UP from flip flop 35e is set to the H level. Output signal S1 of flip flop 35a is at the H level and the output signal of inverter 35c is at the L level. Therefore, since output signal S4 of NAND gate 35d is at the H level, when up instruction signal UP is set to the H level, down instruction signal DWN is set to the L level.

When buffered clock signal BUFCLK goes low, output signal S3 of flip flop 35b goes high again. In flip flop 35a, when feedback clock signal FBCLK goes low, output signal S2 goes high.

If buffered clock signal BUFCLK goes high when feedback clock signal FBCLK is at the L level, output signal S1 of flip flop 35a falls to the L level, and the output signal of inverter 35c rises to the H level. Since feedback clock signal FBCLK is at the L level, output signal S2 of flip flop 35a is at the H level, and output signal S3 of flip flop 35b is at the H level also at the rising edge of buffered clock signal BUFCLK. Therefore, the output signal of NAND gate 35e goes high, output signal S4 of NAND gate 35d goes low, and down instruction signal DWN outputted from flip flop 35e rises to the H level. When down instruction signal DWN rises to the H level, since output signal S3 of flip flop 35b is at the H level, up instruction signal UP falls to the L level.

Therefore, in phase detector 35, the states of up instruction signal UP and down instruction signal DWN are determined depending on whether feedback clock signal FBCLK is at the H or L level at the rising edge of buffered clock signal BUFCLK. Count circuit 37 performs the count-up operation when up instruction signal UP of phase detector 35 is at the H level and performs the count-down operation when down instruction signal DWN is at the L level.

Figure 11:
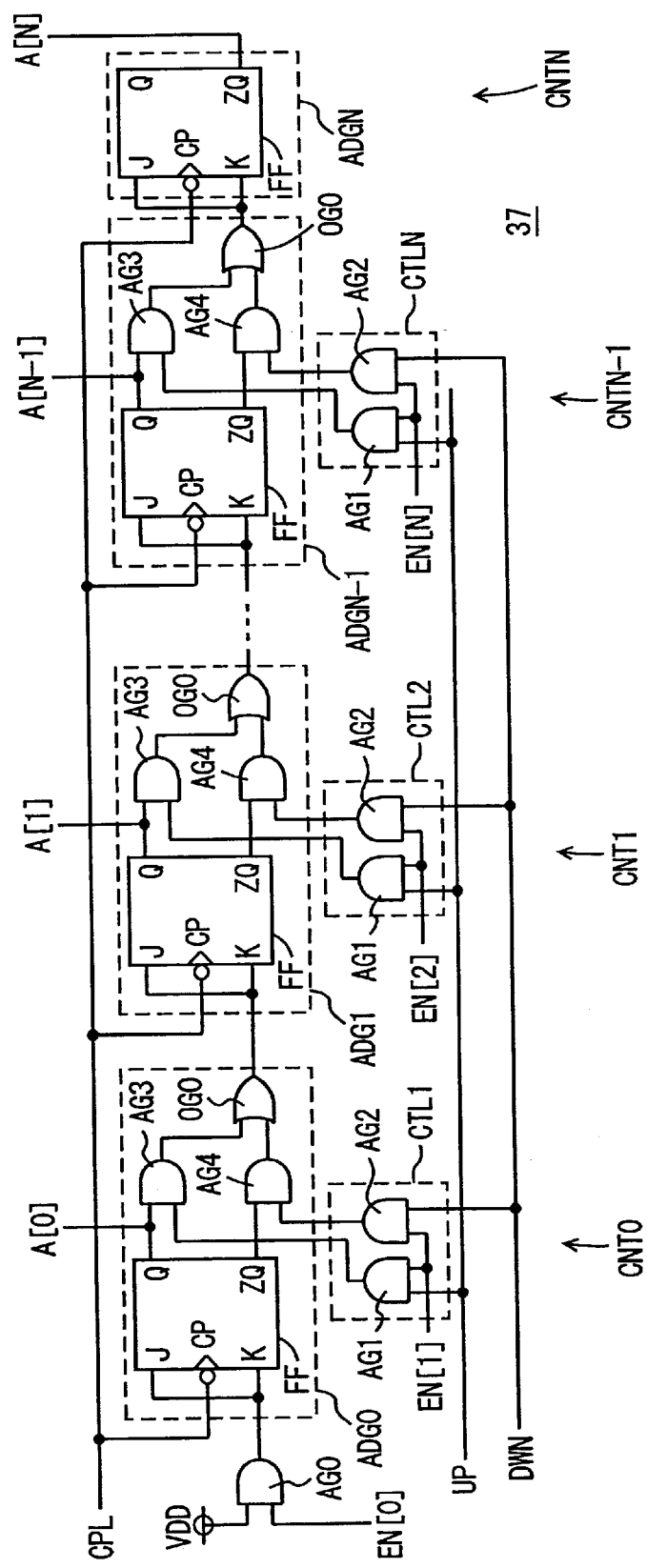
FIG. 11 is a diagram showing the configuration of a counting circuit shown in FIG. 2.

FIG. 11 is a diagram showing an example of the configuration of counting circuit 37 shown in FIG. 2. In FIG. 11, counting circuit 37 includes delay stage address signal generating circuits ADG0 to ADGN for generating delay stage address signals A[0] to A[N], transfer control circuits CTL1 to CTLN, provided in correspondence to delay stage address signal generating circuits ADG0 to ADGN−1, each for controlling transfer of a delay stage address signal of a corresponding delay stage address signal generating circuit to the circuit at the next stage, and an AND gate AGO for controlling the counting operation of delay stage address signal generating circuit ADG0.

Transfer control circuits CTL1 to CTLN are selectively activated according to enable signal bits EN[1] to EN[N], respectively, to cause the corresponding delay stage address signal generating circuits ADG to ADGN to perform the count-up or count-down operation in accordance with up instruction signal UP and down instruction signal DWN.

Transfer control circuits CTL1 to CTLN, having the same configuration, each include: an AND gate AG1 for passing up instruction signal UP when a corresponding one of enable signal bits EN[1] to EN[N] is at the H level; and an AND gate AG2 for passing down instruction signal DWN when a corresponding one of enable signal bits EN[1] to EN[N] is at the H level.

Delay stage address signal generating circuits ADG0 to ADGN−1, having the same configuration, each include: a JK flip flop FF; an AND gate AG3 for transmitting a signal from an output Q of JK flip flop FF when an output signal of ANG gate AG1 of a corresponding transfer control circuit is at the H level; an AND gate AG4 for passing a signal from an output ZQ of corresponding JK flip flop FF when an output signal of AND gate AG2 of a corresponding transfer control circuit is at the H level; and an OR gate OG0 receiving output signals of AND gates AG3 and AG4.

JK flip flop FF has inputs J and K connected together, and receives a count pulse CPL at a clock input CP. An output signal of OR gate OG0 is supplied to inputs J and K of JK flip flop FF of the delay stage address signal generating circuit at the next stage. The output state of JK flip flop FF is determined according to the signals at inputs J and K at the falling edge of count pulse CPL.

AND gate AG0 receives a power supply voltage VDD and enable signal bit EN[0] and applies an output signal thereof to inputs J and K of JK flip flop FF of delay stage address signal generating circuit ADG0.

Delay stage address signal generating circuit ADGN is the circuit at the final stage and includes JK flip flop FF. From output ZQ of the JK flip flop FF, delay stage address signal bit A[N] is outputted.

When all of enable signal bits EN[0] to EN[N] are at the H level, counting circuit 37 executes the counting operation. When up instruction signal UP is at the H level, an output signal of AND gate AG1 is at the H level, and an output signal of AND gate AG2 is at the L level. Therefore, in delay stage address signal generating circuits ADG0 to ADGN-1, AND gate AG3 is enabled, and corresponding delay stage address signal bits A[0] to A[N-1] are transmitted to the respective next stages via OR gates OG0. When both inputs J and K of JK flip flop FF are at the H level, in response to the falling edge of count pulse CPL, the output state of JK flip flop FF is changed. When both inputs J and K of JK flip flop FF are at the L level, JK flip flop FF maintains the output state of the immediately preceding cycle. Therefore, when up instruction signal UP is applied, according to delay stage address signal bits A[0] to A[N-1], the output states of the address signal generating circuits of the respective next stages are set, and the counting operation of counting up the count by one is executed.

On the other hand, when down instruction signal DWN is at the H level, a signal from output ZQ of JK flip flop FF is transmitted to the delay stage address generating circuit of the next stage via AND gate AG4 and OR gate OG0. In this case, therefore, the output state of the delay stage address signal generating circuit of the next stage is set according to the signal from complementary output ZQ, so that an operation of counting down the count by one is executed. Each of delay stage address signal bits A[0] to A[N] is generated from output Q of JK flip flop FF. Therefore, when up instruction signal UP is applied once, if counting circuit 37 performs normal operation in the variable delay line, the delay amount is updated with the delay amount of delay stage DS0 of one stage being the unit.

Figure 36:
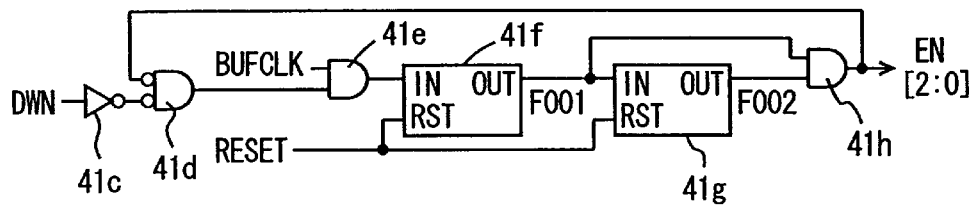
FIG. 36 is a diagram showing the configuration of a count control circuit shown in FIG. 35.
Figure 37:
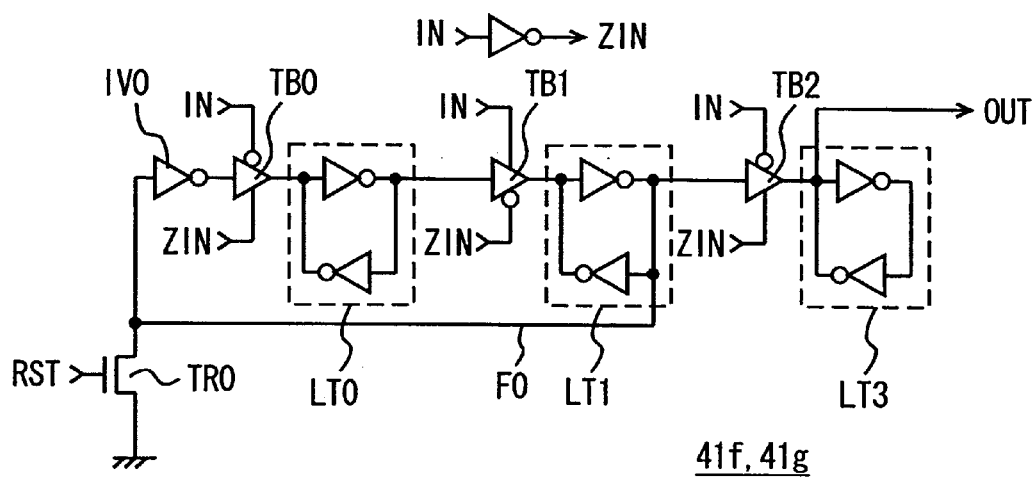
FIG. 37 is a diagram showing an example of the configuration of a shifter shown in FIG. 36.
Figure 38:
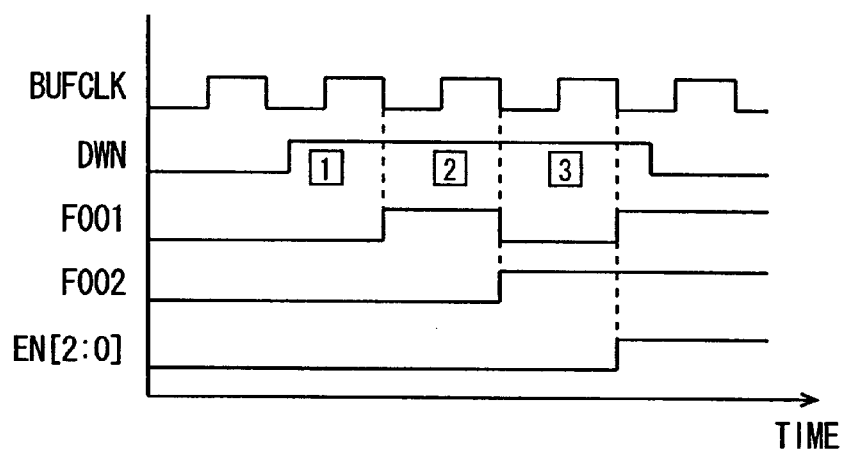
FIG. 38 is a timing chart representing the operation of the count control circuit shown in FIG. 36.
Figure 39:
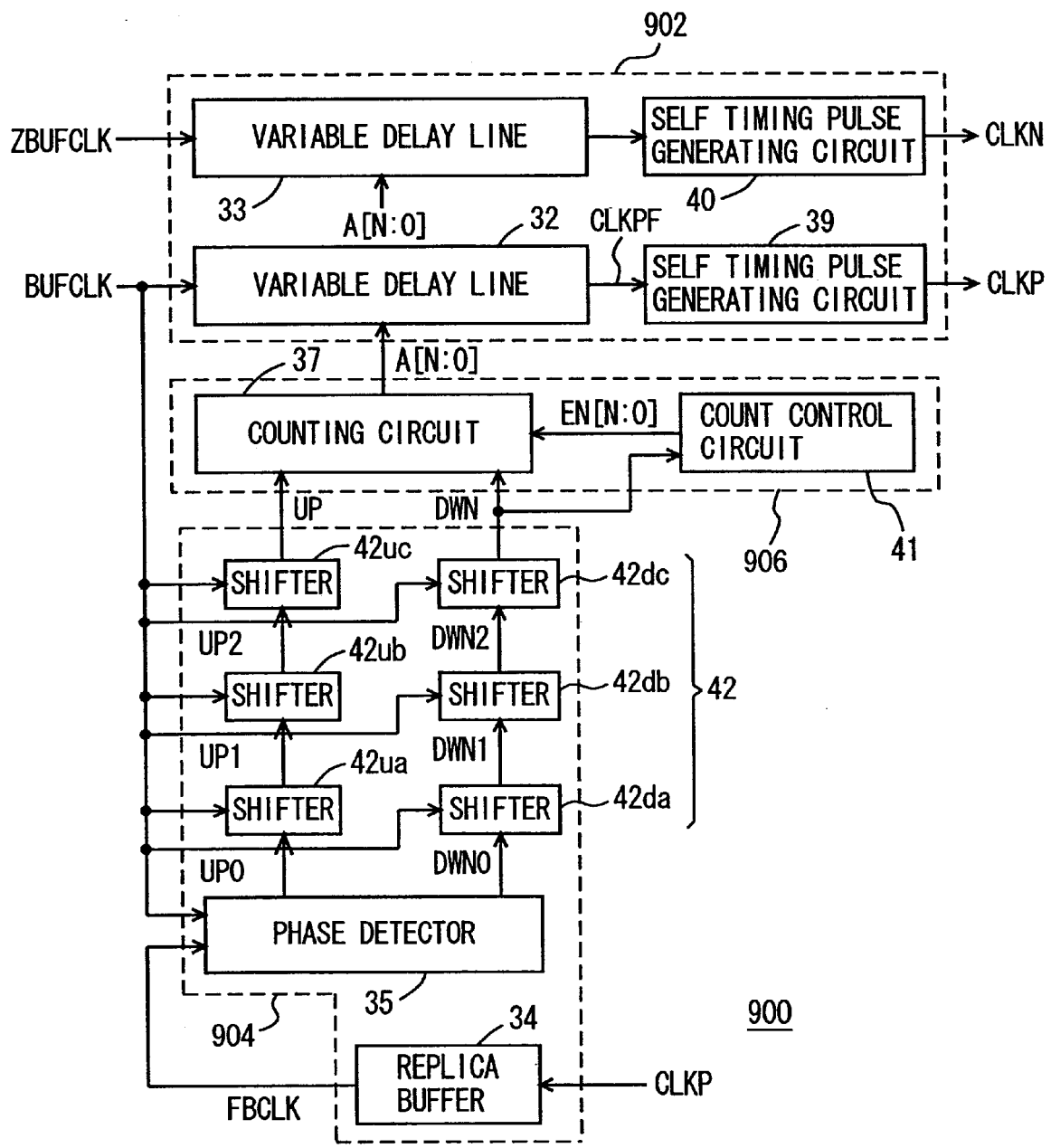
FIG. 39 is a diagram showing the configuration of an internal clock generating circuit illustrate in FIG. 35 more concretely.

Count control circuit 41 shown in FIG. 2 is formed employing the configuration of the count control circuit shown in FIGS. 36 and 37. Specifically, when down instruction signal DWN is generated three times in total, enable signal bits EN[2:0]) are set from the L level to the H level.

Figure 12:
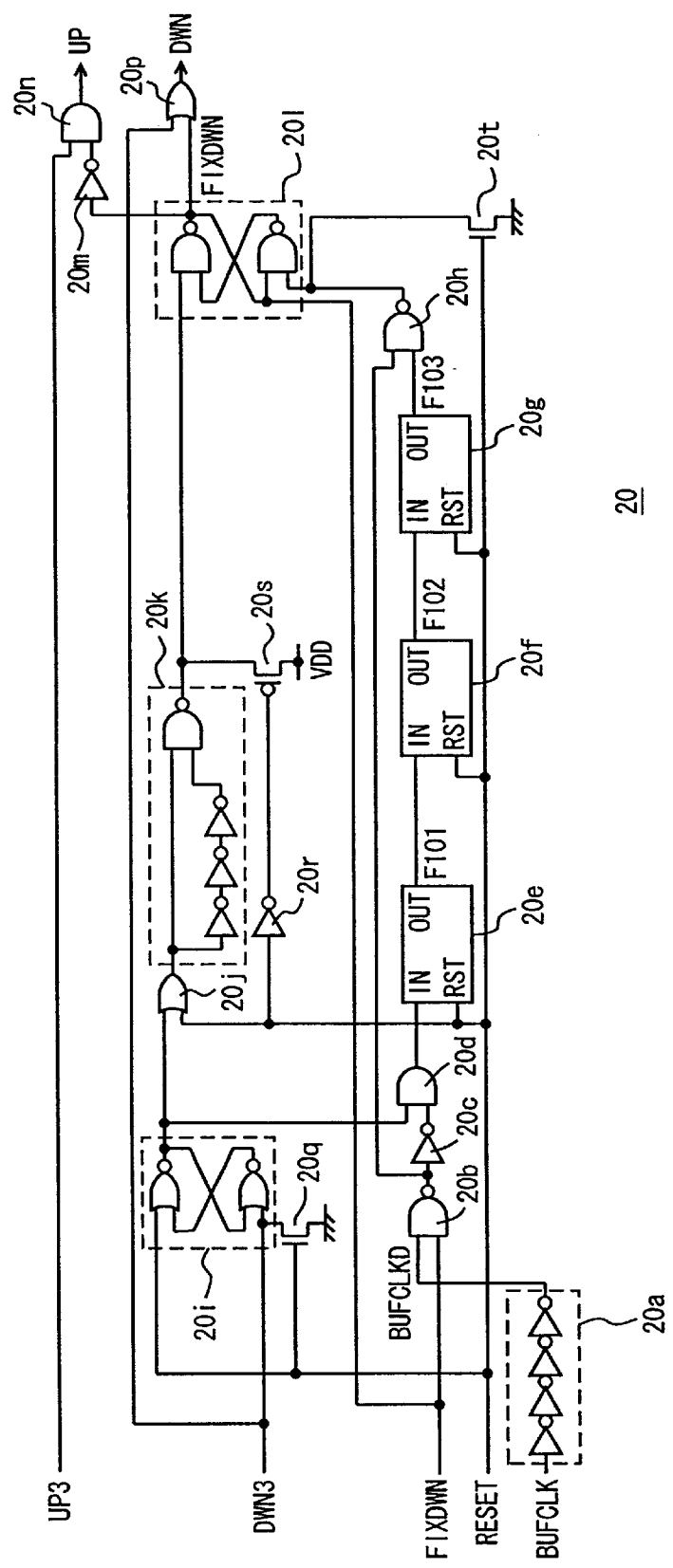
FIG. 12 is a diagram showing the configuration of a delay control circuit shown in FIG. 2.

FIG. 12 is a diagram showing the configuration of delay control circuit 20 shown in FIG. 2. In FIG. 12, delay control circuit 20 includes: a delay circuit 20a for delaying buffered clock signal BUFCLK by a predetermined time; a NAND gate 20b receiving an output signal BUFCLKD of delay circuit 20a and a control signal FIXDWN; an inverter 20c for inverting an output signal of NAND gate 20b; a NOR type flip flop 20i which is set when signal DWN3 from shifter 42c shown in FIG. 2 is activated, and is reset in response to reset signal RESET; an AND gate 20d receiving an output signal of flip flop 20i and an output signal of inverter 20c; a shifter 20e for performing an internal transferring operation when an output signal of AND gate 20d rises to the H level; a shifter 20f for performing an internal transfer when an output signal F101 of shifter 20e rises to the H level; a shifter 20g for performing an internal transferring operation when an output signal F102 of shifter 20f rises to the H level; a NAND gate 20h receiving an output signal of NAND gate 20b and an output signal F103 of shifter 20g; an OR gate 20j receiving reset signal RESET and an output of flip flop 20i; and a one-shot pulse generating circuit 20k for generating a one-shot pulse signal in response to the rising edge of an output signal of OR gate 20j.

Each of shifters 20e to 20g has the same configuration as that of shifters 41f and 41g shown in FIG. 37, and output signals F101 to F103 of shifters 20e to 20g are initialized to the L level in response to activation of reset signal RESET.

One-shot pulse generating circuit 20k includes three inverters which are cascade connected and a NAND gate receiving an output signal of OR gate 20j and an output signal of the three inverters. Therefore, from one-shot pulse generating circuit 20k, a pulse signal which goes low for predetermined time in response to the rising edge of an output signal of OR gate 20j is generated.

Delay control circuit 20 further includes: a NAND type flip flop 20l set in response to an output pulse of one-shot pulse generating circuit 20k and reset in accordance with an output signal of NAND gate 20h; an inverter 20m receiving output signal FIXDWN of flip flop 20l; an OR gate 20p receiving output signal DWN3 of shifter 42dc shown in FIG. 2 and output signal FIXDWN of flip flop 20l and generating down instruction signal DWN; and an AND gate 20n receiving an output signal of inverter 20m and an output signal UP3 of shifter 42ua shown in FIG. 2 and generating up instruction signal UP.

Flip flop 20l sets its output signal FIXDWN to the H level when an output pulse of one-shot pulse generating circuit 20k goes low and resets its output signal FIXDWN to the L level when an output signal of NAND gate 20h goes low.

Delay control circuit 20 further includes: an N-channel MOS transistor 20q for resetting flip flop 20i in response to reset signal RESET; an inverter 20r receiving reset signal RESET; a P-channel MOS transistor 20s for resetting an output signal of one-shot pulse generating circuit 20k to the H level in accordance with an output signal of inverter 20r; and an N-channel MOS transistor 20t for resetting output signal FIXDWN of flip flop 20l to the L level in response to reset signal RESET.

In delay control circuit 20, when the signal DWN3 from shifter 42dc rises to the H level, down instruction signal DWN is forcedly set to the H level in the period of continuous three cycles, thereby performing a delay amount decreasing operation. By successively performing the delay decreasing operation over three cycles, the delay amount excessively increased is compensated for.

Figure 13:
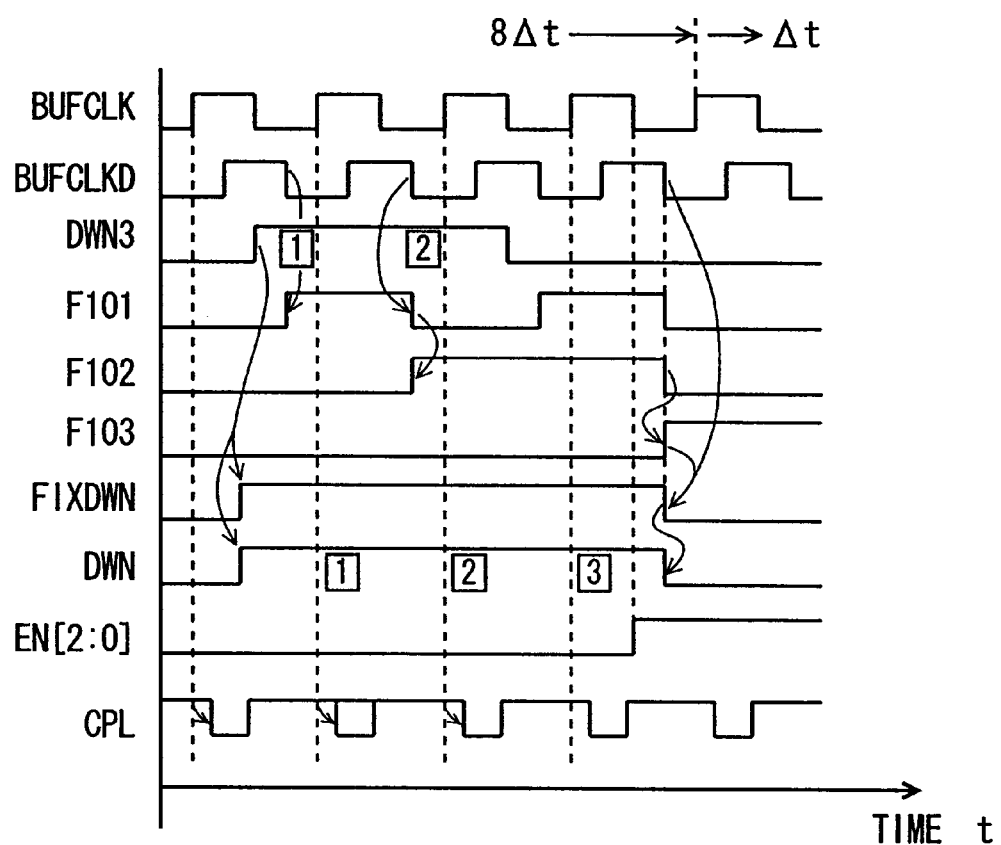
FIG. 13 is a timing chart representing the operation of the delay control circuit shown in FIG. 12.

FIG. 13 is a timing chart representing the operation of delay control circuit 20 shown in FIG. 3. Referring to FIG. 13, the operation of the DLL circuit shown in FIGS. 2 to 12 will be described below.

Figure 20:
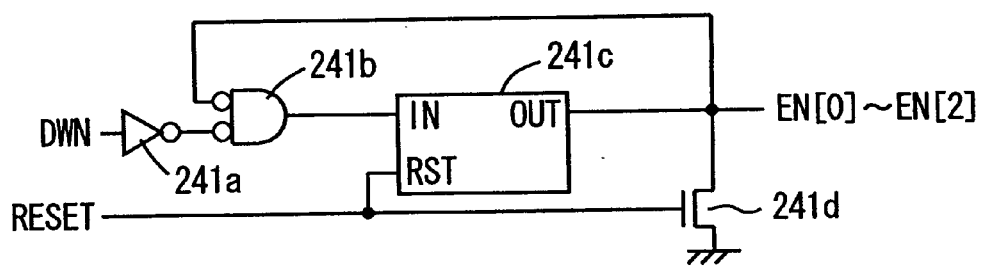
FIG. 20 is a diagram showing the configuration of a count control circuit shown in FIG. 19.

After power on or after the system resetting, when a DLL reset command is supplied to semiconductor memory device 1, under control of control circuit 8 shown in FIG. 1, reset signal RESET is generated in the form of a one-shot pulse set at the H level for a predetermined period. By reset signal RESET, DLL circuit 16 is initialized, and down instruction signal DWN from delay control circuit 20 shown in FIG. 20 is initialized to the L level.

In count control circuit 41 as well, as shown in FIG. 36, according to reset signal RESET, all of enable signal bits EN[2:0] are initialized to the L level. Enable signal bits EN[3] to EN[N] are fixed to the H level. Therefore, in counting circuit 37 shown in FIG. 11, in an initial state, the counting operation of delay stage address signal generating circuits ADG0 to ADG2 is inhibited (since an output signal of OR gate OG0 is set to the L level and an output signal of AND gate AG0 is at the L level). By delay time of default values of variable delay lines 32 and 33, the count value (initial value of delay stage address signal A[0:N]) at the time of initialization of counting circuit 37 is determined to an appropriate value.

After DLL circuit 16 is reset, phase comparator 38 operates, and complementary up instruction signal UP0 and down instruction signal DWN0 are generated from phase detector 35 and supplied to delay control circuit 20 via shifters 42ua to 42uc and shifters 42da to 42dc shown in FIG. 2. In the shift cycles of the shifters, enable signal bits EN[0] to EN[2] are at the L level, delay stage address signals A[0] to A[2]) are not updated, and are maintained at the initial values, and only a part expressed by delay stage address signals A[3] to A[N] is updated. Therefore, until down instruction signal DWN reaches the H level after DLL circuit 16 is reset, in variable delay lines 32 and 33, since the delay amount changes with delay stage address signal bit A[3] being the least significant bit in the counting operation, the delay time changes in a unit of the delay time of 8 Δt. The delay change amount of variable delay lines 32 and 33 until down instruction signal DWN falls to the L level is not limited to 8 Δt, but may be another appropriate value.

When the signal DWN3 from shifter 42dc rises to the H level through the shifting operation, flip flop 20i is set and its output signal rises to the H level. According to the signal DWN3, down instruction signal DWN from OR gate 20p rises to the H level. In response to the rising edge of an output signal of OR circuit 20j, one-shot pulse generating circuit 20k generates a one-shot pulse, flip flop 20l is set, to set its output signal FIXDWN to the H level. Therefore, when signal DWN3 from shifter 42dc rises to the H level, flip flops 20i and 20l are set. Consequently, irrespective of the logic level of signal DWN3 in the next cycle, down instruction signal DWN is fixed to the H level.

When delay buffered clock signal BUFCLKD from delay circuit 20a goes high, an output signal of inverter 20c goes high. When an output signal of flip flop 20i is set to the H level, in response to the rising edge of delay buffered clock signal BUFCLKD, an output signal of AND gate 20d goes high. When the output signal of AND gate 20d rises to the H level, shifter 20e performs an internal transferring operation. When the output signal of AND gate 20d falls to the L level in response to the falling edge of delay buffered clock signal BUFCLKD, the internal signal latched by shifter 20e is outputted, and this output signal F101 goes high. While flip flop 20l is in a set state and its output signal FIXDWN is at the H level, shifter 20e performs the shifting operation and the logic level of output signal F 101 of shifter 20e changes in response to the falling edge of delay buffered clock signal BUFCLKD.

Shifter 20f performs the internal transferring operation when the output signal of shifter 20e is at the H level and outputs the latched internally transferred signal in response to the falling edge of output signal F101 of shifter 20e. Therefore, from shifter 20f, output signal F102 of which logic level changes in response to the falling edge of output signal F101 of shifter 20e is generated.

Shifter 20g performs similar shifting operation. When output signal F102 of shifter 20f changes from the H level to the L level, the output signal F103 of shifter 20g goes high. By performing the shifting operation in shifters 20e to 20g for the period of three clock cycles, down instruction signal DWN can be set to the H level at the rising edge of buffered clock signal BUFCLK successively for the period of three clock cycles after signal DWN3 rises to the H level.

When output signal F103 of shifter 20e is at the H level, in response to the falling edge of buffered clock signal BUFCLKD, an output signal of NAND gate 20e rises to the H level and accordingly, an output signal of NAND gate 20h falls to the L level. Therefore, flip flop 20l is reset, its output signal FIXDWN is reset to the L level, and down instruction signal DWN also falls to the L level. Subsequently, according to signal DWN3 from the shifter, OR gate 20b generates down instruction signal DWN, and AND gate 20p generates up instruction signal UP in accordance with signal UP3 from the shifter.

Where down instruction signal DWN is forcedly set to the H level over the period of three clock cycles, the output signal of inverter 20m is at the L level and up instruction signal UP is at the L level.

After power is on, when signal DWN3 from the shifter rises to the H level for the first time, flip flop 20i is set and its output signal is set to the H level. Subsequently, flip flop 20i is maintained at a set state and its output signal is maintained at the H level. Therefore, when signal DWN3 from shifter 42dc rises to the H level for the first time, down instruction signal DWN is forcedly set to the H level for the period of successive three clock cycles to forcedly decrease the delay amount in a unit of 8 Δt. After lapse of the period of three clock cycles, flip flop 20i maintains the set state, flip flop 20l maintains the reset state, and down instruction signal DWN changes according to signal DWN3 from the shifter.

When down instruction signal DWN is activated three times in total, count control circuit 41 sets enable signal bits EN[0:2] to the H level in response to the falling edge of buffered clock signal BUFCLK. Therefore, when the three clock cycles elapse, the least significant count bit of counting circuit 37 becomes A[0] and the delay amount change unit of variable delay circuits 32 and 33 from the next cycle is set to Δt.

To counting circuit 37 shown in FIG. 11, count pulse CPL which is set to the L level for a predetermined period in response to the rising edge of buffered clock signal BUFCLK, is supplied. Therefore, after the states of down instruction signal DWN and up instruction signal UP are made definite at the rising edge of buffered clock signal BUFCLK, the counting operation is performed in counting circuit 37.

Figure 14:
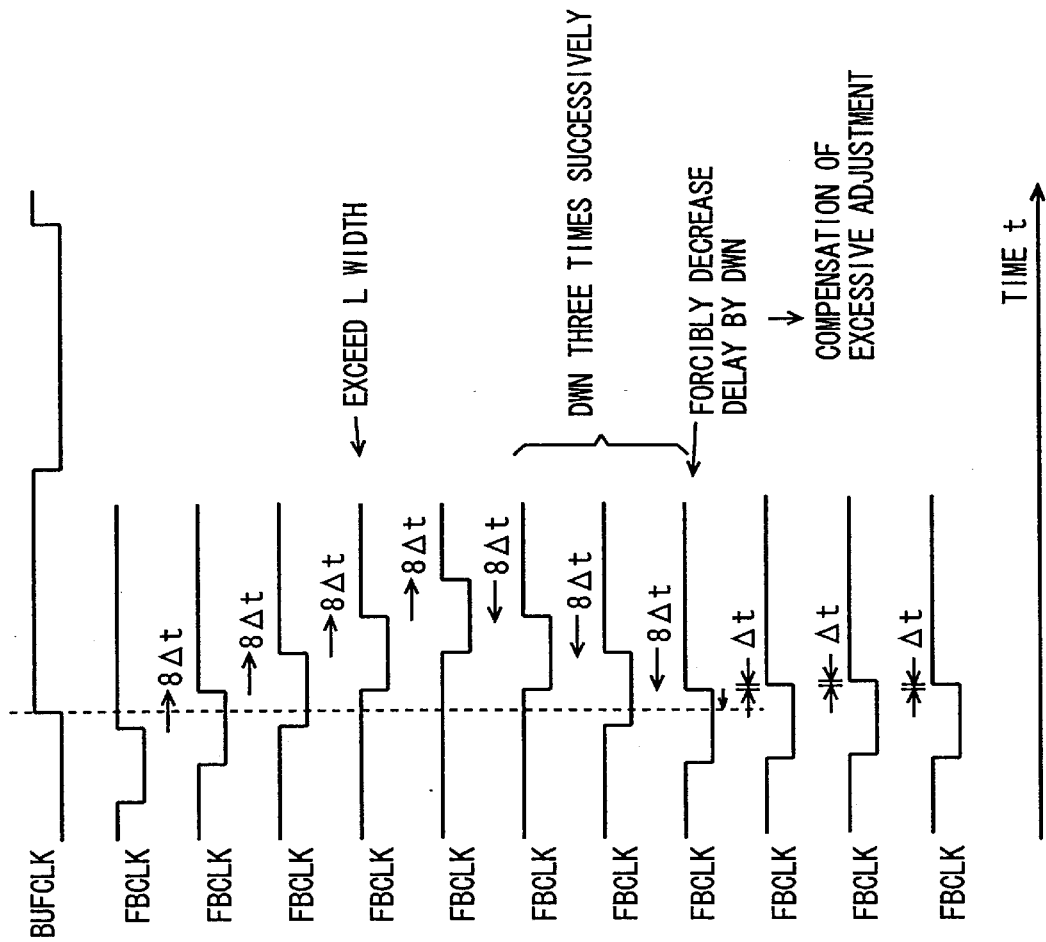
FIG. 14 is a timing chart representing the operation of the DLL circuit shown in FIG. 2.

FIG. 14 is a diagram illustrating the phase adjusting operation of DLL circuit 16 according to the first embodiment of the present invention. Referring to FIG. 14, the phase adjusting operation of the DLL circuit according to the first embodiment will be described.

It is now assumed that in cycle number 0, output signal UP0 of phase detector 35 and all of output signals of shifters 42ua to 42uc are at the H level and up instruction signal UP outputted from delay control circuit 20 is also at the H level. In cycle number 0, at the rising edge of buffered clock signal BUFCLK, feedback clock signal FBCLK is at the H level. In this state, output signal UP0 of phase detector 35 is at the H level. According to up instruction signal UP, the delay amount is increased by 8 Δt.

In clock cycle number 1, feedback clock FBCLK falls to the L level at the rising edge of buffered clock signal BUFCLK. At this time, output signal UP0 of phase comparator 35 is at the L level. However, up instruction signal UP is at the H level, and the phase of feedback clock signal FBCLK is delayed by 8 Δt. In clock cycle number 2, when feedback clock signal FBCLK is still at the L level at the rising edge of buffered clock signal BUFCLK, output signal UP0 of phase comparator 35 falls to the L level. At this time as well, up instruction signal UP is at the H level and the delay amount of feedback clock signal FBCLK is increased by 8 Δt.

In clock cycle number 3, phase correction is performed exceeding the L level period of feedback clock signal FBCLK, and feedback clock signal FBCLK rises to the H level at the rising edge of buffered clock signal BUFCLK. In cycle 3 as well, up instruction signal UP is at the H level and the delay amount of feedback clock signal FBCLK is increased.

In clock cycle number 4, up instruction signal UP is set to the L level in accordance with output signal UP3 from the shifter. In this case, down instruction signal DWN is at the H level, and the phase delay amount of feedback clock signal FBCLK is decreased by 8 Δt. In the following cycle number 5 as well, up instruction signal UP is at the L level and down instruction signal DWN is at the H level, so that the delay amount of feedback clock signal FBCLK is decreased by 8 Δt.

In clock cycle number 6, even when output signal UP3 of the shifter goes high, down instruction signal DWN outputted from delay control circuit 20 is at the H level. Irrespective of output signal UP3 of the shifter, the delay amount of feedback clock signal FBCLK is decreased by 8 Δt.

During the period of three clock cycles 4 to 6, up instruction signal UP is at the L level, and output signals of shifters 42dc and 42ua in the clock cycle number 6 are neglected in delay control circuit 20.

In clock cycle number 7, according to output signal UP3 of the shifter, up instruction signal UP is set to the H level. By this time, the delay amount decreasing operation has been performed over three clock cycles successively. Therefore, according to the falling of buffered clock signal BUFCLK in clock cycle number 6, enable signal bits EN[0] to EN[2] from count control circuit 41 are set to the H level. Accordingly, the delay amount adjustment in the clock cycle number 7 is performed on the basis of the delay amount Δt of delay stage DS0. Subsequently, according to output signals UP3 and DWN3 from the shifter, the phase adjustment of feedback clock BUFCLK is executed in a unit of the delay amount Δt.

In the case where the phase adjustment is performed excessively due to the time lag of the shifter and the L period of feedback clock signal FBCLK exceeds the rising edge of buffered clock signal BUFCLK, the excessive phase adjustment is due to the time lag of the period of the three clock cycles by the shifters of three stages. Therefore, by decreasing the delay amount of buffered clock signal BUFCLK over three cycles successively, the excessive delay increase of three cycles can be compensated for.

By performing the phase correction in a unit of the minimum delay amount Δt after compensating for the excessive delay amount increase, the influence of the time lag due to the shifting operation of the shifters can be eliminated, and the phase adjustment can be carried out effectively using the L level period of the self timing pulse. Accordingly, feedback clock signal FBCLK can be locked with the rising edge of buffered clock signal BUFCLK at a faster timing.

Therefore, even if the L level period of the self timing pulse varies due to variations in process parameters and other(s), the phase adjusting operation can be performed while eliminating the influence of such process variation with reliability. The number of clock cycles required until the phase of the internal clock signal is synchronized (locked) with the phase of the external clock signal can be reliably prevented from being increased.

Although the shifters of three stages are used in the above configuration, shifters of M stages may be provided. In this case, down instruction signal DWN is set to the H level for the period of successive M cycles. Accordingly, the shifters (20e to 20g) shown in FIG. 12 are cascaded into M stages.

As described above, according to the first embodiment of the present invention, in the case of adjusting the delay amount of the variable delay lines by the output signal of the phase detector via the shifters, when the down instruction signal goes high for the first time, the delay amount is forcedly decreased by the number of shifters successively. Therefore, the delay stage address signal can be suppressed from entering a metastable state by the use of the shifters. In adjustment of the phase difference between buffered clock signal BUFCLK and feedback clock signal FBCLK, the phase can be prevented from being excessively adjusted due to the time lag of the shifters. After power is on, the internal clock signal synchronized in phase with the external clock signal can be stably generated.

Second Embodiment

Figure 15:
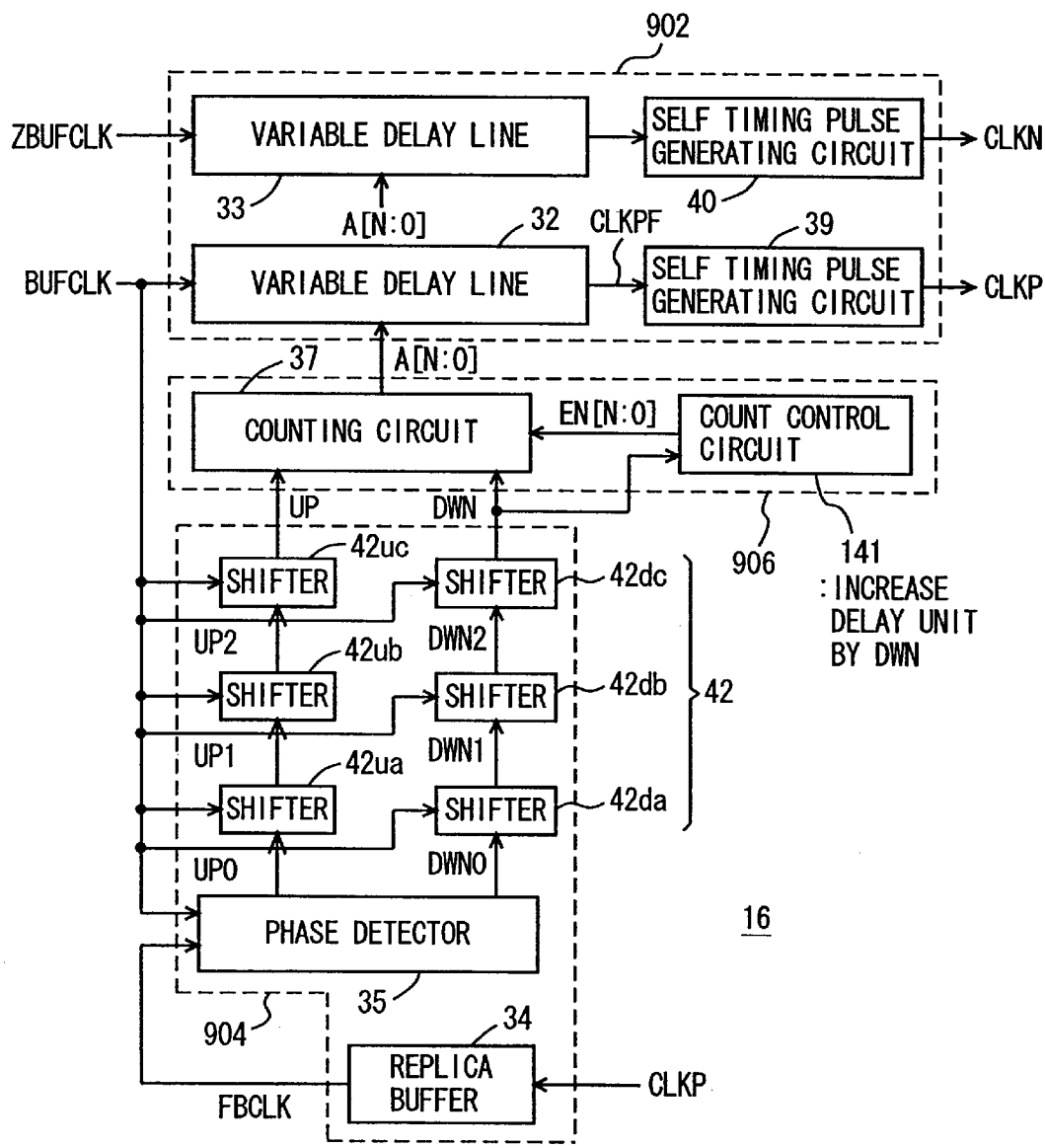
FIG. 15 is a diagram schematically showing the configuration of a DLL circuit according to a second embodiment of the present invention.
Figure 40:
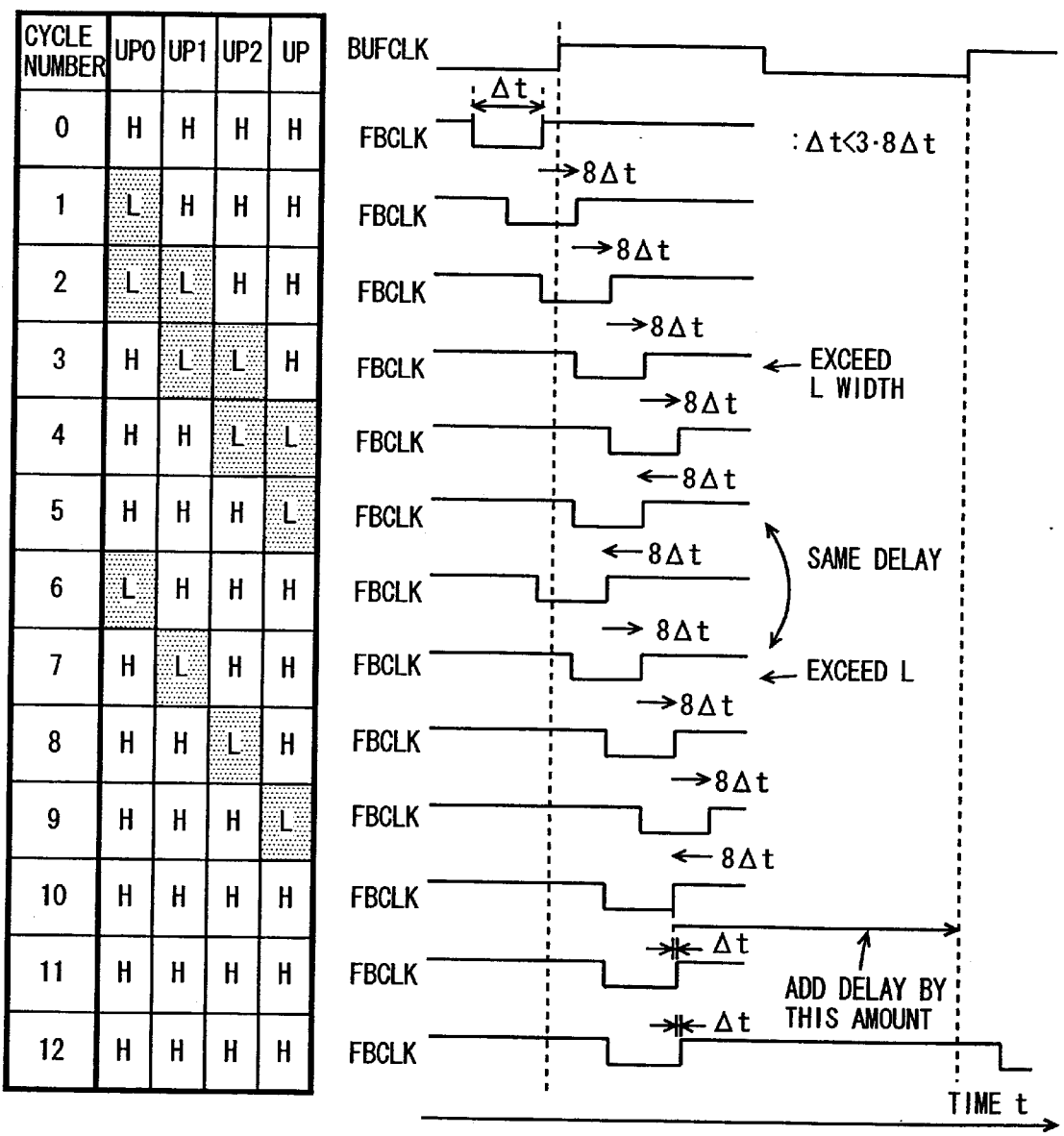
FIG. 40 is a diagram representing a phase adjusting operation of the internal clock generating circuit shown in FIG. 39.

FIG. 15 is a diagram schematically showing the configuration of a DLL circuit according to a second embodiment of the present invention. The DLL circuit shown in FIG. 15 is different from the DLL circuit shown in FIG. 40 in the following point. In phase control circuit 906, when down instruction signal DWN is supplied from shifter 42dc for the first time, a count control circuit 141 makes the delay unit greater in that cycle than in the other cycles. Count control circuit 141 adjusts the delay amounts of variable delay lines 32 and 33 on the basis of the delay time according to the number of stages of shifters in shifting circuit 42 until down instruction signal DWN is generated for the first time. When down instruction signal DWN is set to the H level for the first time, count control circuit 141 further increases its delay amount, for example, by the amount according to the number of shifters in shifting circuit 42. After this cycle is completed, count control circuit 141 sets all of enable signals EN[N:0] to the H level. The other configuration of the DLL circuit shown in FIG. 15 is the same as that of the DLL circuit shown in FIG. 40, the same reference numerals are allotted to corresponding components, and their detailed description will not be repeated.

In the second embodiment of the present invention, the influence of the time lag by the shifters of shifting circuit 42 is compensated for by further increasing the delay amount in one cycle period.

Figure 16:
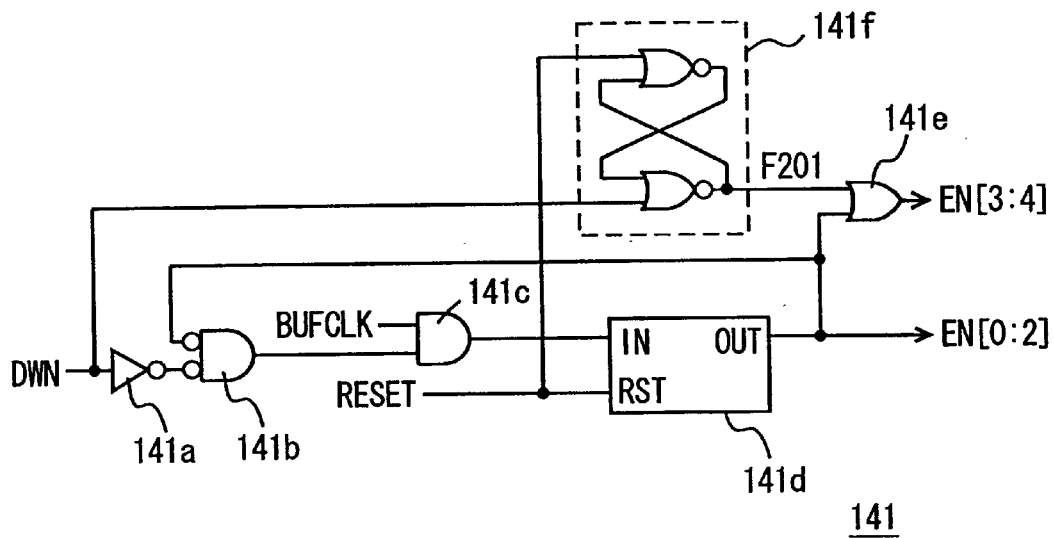
FIG. 16 is a diagram showing the configuration of a count control circuit shown in FIG. 15.

FIG. 16 is a diagram showing the configuration of count control circuit 141 shown in FIG. 15. In FIG. 16, count control circuit 141 includes: an inverter 141a receiving down instruction signal DWN from shifter 42dc shown in FIG. 15; a NOR type flip flop 141d set in response to activation of down instruction signal DWN and reset in response to reset signal RESET; a NOR gate 141b receiving an output signal of inverter 141a and an output signal of a shifter 141d; an AND gate 141c receiving an output signal of a NOR gate 141b and buffered clock signal BUFCLK; and an OR gate 141e receiving an output signal of shifter 141d and an output signal F201 of flip flop 141d and generating an enable signal EN[3:4].

Enable signals EN[0:2] are outputted from shifter 141d. An output signal of each of OR gate 141e and shifter 141d consists of one bit, and enable signal bits EN[3:4] are controlled commonly in accordance with an output signal of OR gate 141e. In accordance with the output signal of shifter 141d, enable signal bits EN[0:2] are commonly controlled.

Shifter 141d has the configuration shown in FIG. 37, performs an internal transferring operation when a signal applied to input IN of shifter 141d is at the H level, and frequency-divides an output signal of AND gate 141c.

Figure 17:
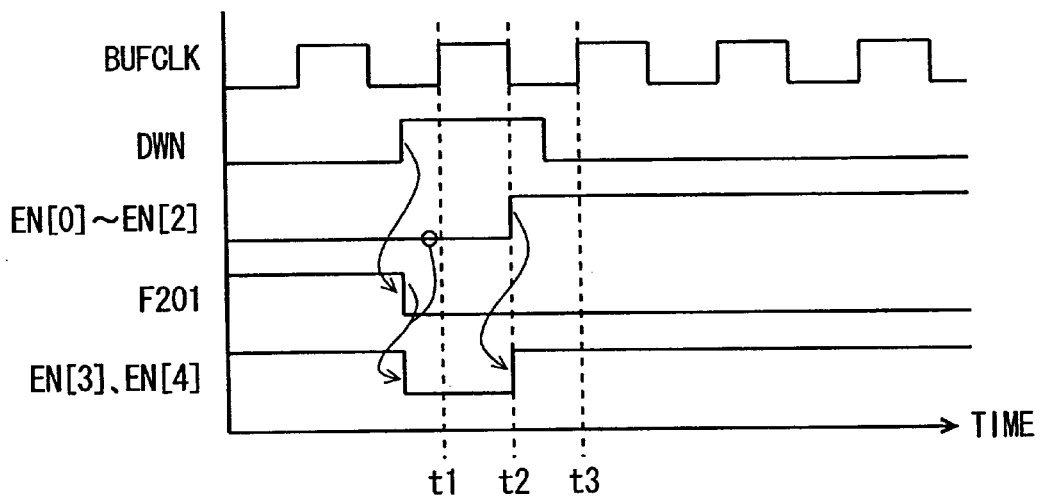
FIG. 17 is a timing chart representing the operation of the count control circuit shown in FIG. 16.

FIG. 17 is a timing chart representing the operation of a count control circuit 41A shown in FIG. 16. With reference to FIG. 17, the operation of count control circuit 141 shown in FIG. 16 will be described below.

After power is on, a DLL reset command is inputted to semiconductor memory device 1, and reset signal RESET is kept at the H level for a predetermined period. Accordingly, flip flop 141d is reset and its output signal F201 is set to the H level. Accordingly, an output signal of OR circuit 141e goes high and both enable signal bits EN[3:4] (bits EN[3] and EN[4]) are set to the H level.

On the other hand, the initializing operation is performed in shifter 141d in accordance with reset signal RESET, and all of enable signal bits EN[0] to EN[2] are initialized to the L level.

By the detecting operation of phase detector 35, complementary signals UP0 and DWN0 are transferred via the shifters of shifting circuit 42. In this case, enable signals EN[0:2] are at the L level, delay stage address signal bits A[0] to A[2] of counting circuit 37 are not updated, and a part expressed by delay stage address signal bits A[3] to A[N] is updated. Therefore, until down instruction signal DWN is set to the H level after resetting of the DLL, the delay amount of variable delay lines 32 and 33 changes on the basis of the delay amount (8 Δt) by delay circuits of eight stages.

When down instruction signal DWN goes high, flip flop 14d is set, and its output signal F201 falls to the L level. Since enable signals EN[0:2] are at the L level, a signal from OR circuit 141e goes low, and enable signal bits EN[3] and EN[4]) are accordingly set to the L level.

Therefore, at time t1 of the rising edge of buffered clock signal BUFCLK for decreasing the value of delay stage address signal A[0:N] for the first time after down instruction signal DWN attains to the H level for the first time, only a part expressed by delay stage address signal bits A[5] to A[N] is updated. In this case, according to down instruction signal DWN, the number of delay stages of variable delay lines 32 and 33 is decreased. Delay stage address signal A[5] corresponds to the delay stage of a delay amount 32 Δt. By the counting operation in counting circuit 37, count of 32 (in decimal) is counted down, and delay time of 32 Δt is decreased in variable delay lines 32 and 33. The decrease in the delay amount corresponds to decreasing of the 8 delay units (8 Δt) of four times.

When buffered clock signal BUFCLK goes high, an output signal of AND gate 141c goes high, and the internal transferring operation is performed in shifter 141d. Therefore, when buffered clock signal BUFCLK falls to the L level, an output signal of shifter 141d rises to the H level and, accordingly, enable signal bits EN[0]) to EN[2] rise to the H level. Accordingly, an output signal of OR circuit 141e goes high, and both enable signal bits EN[3] and EN[4] also go high. Therefore, the adjusting operation at time t3 of the following rising edge of buffered clock signal BUFCLK is performed on the basis of the minimum delay amount Δt.

Count control circuit 141 shown in FIG. 16 is used to compensate for the excessive phase increase due to the shifting operation in the shifter in one clock cycle when down instruction signal DWN is set to the H level for the first time. Therefore, even when the L level period of feedback clock signal FBCLK changes exceeding the rising edge of buffered clock signal BUFCLK, such excessive phase adjustment can be compensated for in one clock cycle with reliability. An internal clock signal synchronized in phase with an external clock signal can be generated at high speed.

Figure 18:
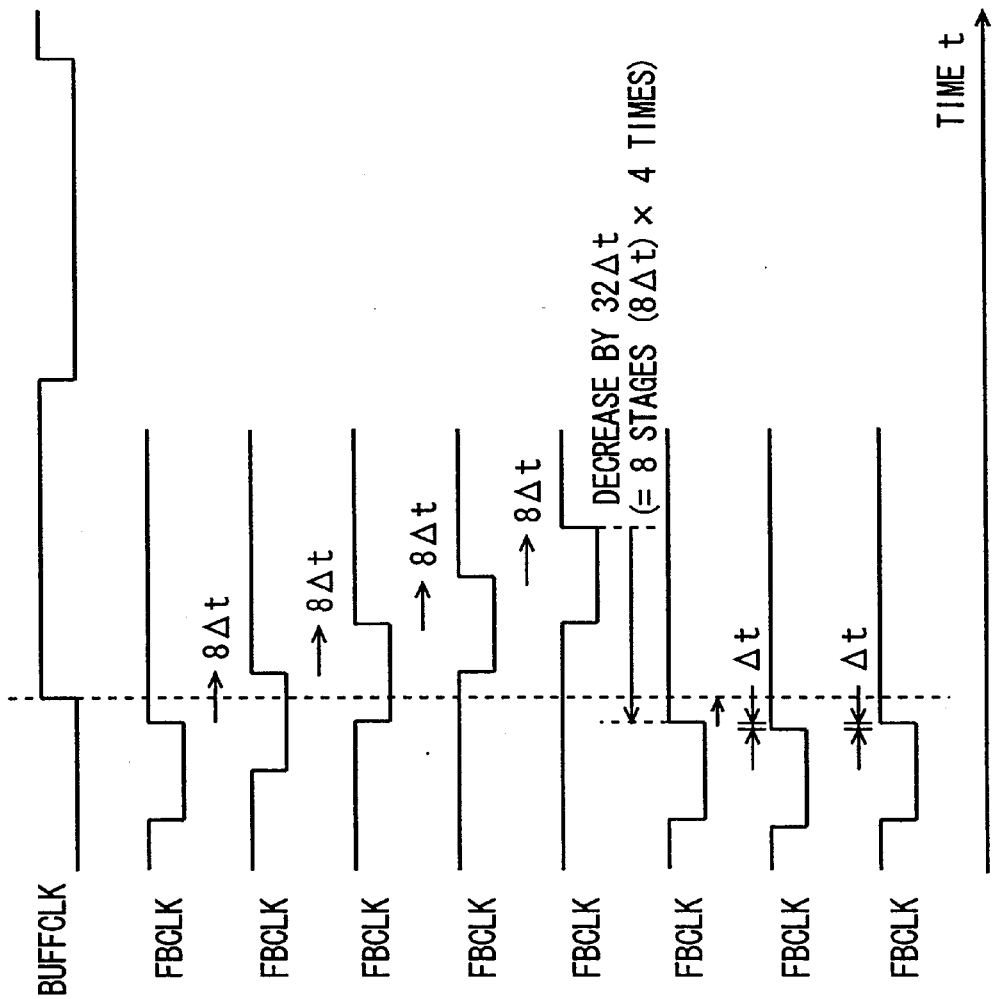
FIG. 18 is a timing chart representing the operation of the DLL circuit shown in FIG. 15.

FIG. 18 is a diagram illustrating the operation of the DLL circuit according to the second embodiment of the present invention. In FIG. 18, the case is considered that up instruction signal UP from the shifter in the final stage is at the H level. Down instruction signal DWN is at the L level. In this case, the phase delay amount of feedback clock signal FBCLK is increased on the basis of 8 Δt until clock cycle number 3. In clock cycle numbers 1 and 2, output signal UP0 of phase detector 35 is at the L level.

In clock cycle number 4, when up instruction signal UP falls to the L level, that is, down instruction signal DWN rises to the H level, the delay amount of feedback clock signal FBCLK is decreased by 32 Δt and the phase of feedback clock signal FBCLK is restored to the same value as that in clock cycle number 0 that is four clock cycles before. In the clock cycle number 4, the delay amount unit is set to Δt.

In the following clock cycle number 5 as well, up instruction signal UP is at the L level. At this time, the phase of feedback clock signal FBCLK is decreased in a unit of the minimum delay amount Δt.

In clock cycle number 6, up instruction signal UP is at the H level, so that a process of increasing the delay amount of feedback clock signal FBCLK is performed.

In the delay amount increasing process, the rising edge of feedback clock signal FBCLK occurs before the rising edge of buffered clock signal BUFCLK. Thus, the rising edge of feedback clock signal FBCLK can be made synchronized with the rising edge of buffered clock signal BUFCLK in a small number of cycles.

If shifters of M stages are disposed in shifting circuit 42, count control circuit 141 can be constructed such that when down instruction signal DWN rises to the H level for the first time, arbitrary K stages of shifters are reduced at once in the following delay stage address changing cycle. In count control circuit 41A shown in FIG. 16, by setting the bit range of enable signal EN controlled by OR gate 141e so as to correspond to the delay amount of K stages, the above construction can be easily implemented.

As described above, according to the second embodiment of the present invention, when the down instruction signal rises to the H level for the first time, the delay change amount per cycle of the variable delay line is set to the number of the stages of shifters+one stage. The influence of the time lag due to the shifting operation in the shifting circuit can be suppressed and the feedback clock signal can be synchronized in phase with the internal buffered clock signal. Since the shifter for transferring an output signal of the phase detector is utilized, the delay stage address signal outputted from the counting circuit can be suppressed from becoming metastable. Thus, the internal clock signal synchronized in phase with the external clock signal can be generated stably at high speed.

Third Embodiment

Figure 19:
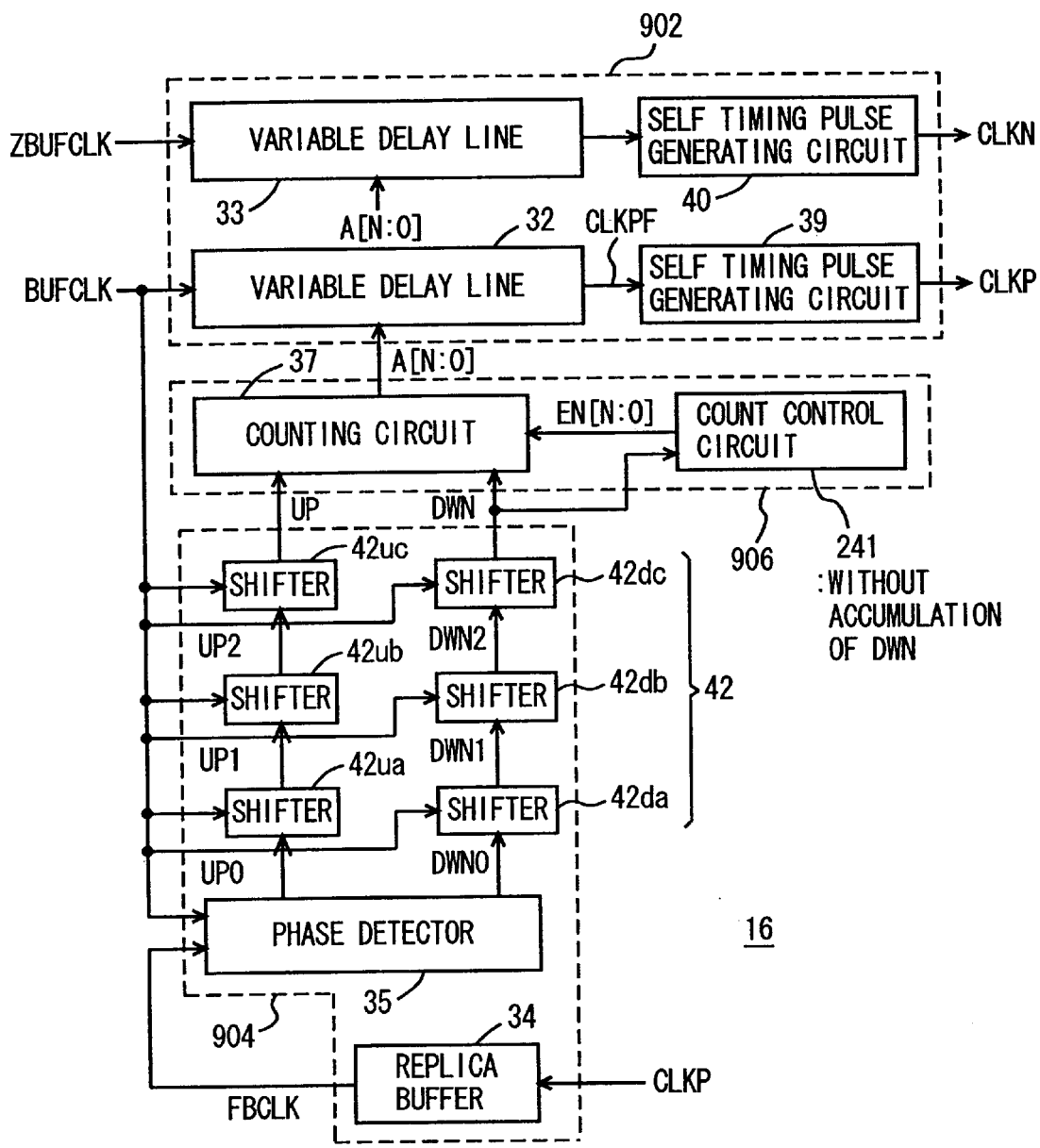
FIG. 19 is a diagram schematically showing the configuration of a DLL circuit according to a third embodiment of the present invention.

FIG. 19 is a diagram schematically showing the configuration of DLL 16 according to a third embodiment of the present invention. In DLL circuit 16 shown in FIG. 19, in phase control circuit 906, a count control circuit 241 generates an enable signal EN[N:0] to counting circuit 37 in accordance with down instruction signal DWN from phase comparator 904. Count control circuit 241 does not perform an accumulating operation of down instruction signal DWN but sets all of enable signal bits EN[N:0] to the H level when first generated down instruction signal DWN falls to the L level. The other configuration of DLL circuit 16 show in FIG. 19 is the same as that of DLL circuit 16 shown in FIG. 15, the same reference numerals are allotted to corresponding parts, and their detailed description will not be repeated.

FIG. 20 is a diagram showing the configuration of count control circuit 241 shown in FIG. 19. Count control circuit 241 includes: an inverter 241a receiving down instruction signal DWN from shifter 42dc shown in FIG. 19; a NOR gate 241b receiving enable signal EN and an output signal of inverter 241a; a shifter 241c for performing a shifting operation in accordance with an output signal of NOR gate 241b, to generate enable signal EN (EN[0] to EN[2]); and an N-channel MOS transistor 241d for initializing enable signal bits EN[0] to EN[2] to the L level in accordance with reset signal RESET. Shifter 241c is a one-bit shifter, and enable signal bits EN[0] to EN[2] are commonly controlled by shifter 241c.

Shifter 241c has a configuration similar to that of each of shifters 41f and 41g shown in FIG. 37, performs an internal transferring operation when a signal applied to input IN is at the H level and outputs a signal of an internal node when a signal applied to input IN falls to the L level. Reset signal RESET is applied to reset input RST of shifter 241c. The internal node of shifter 241c is set to the L level in response to reset signal RESET.

Figure 21:
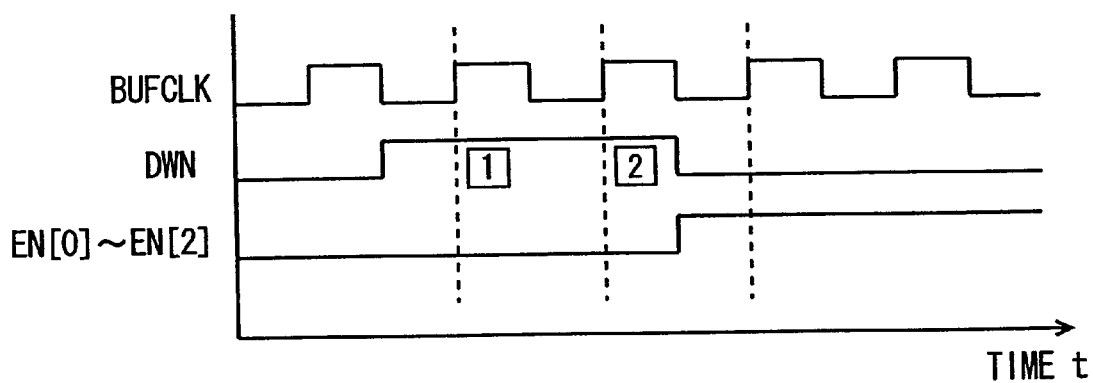
FIG. 21 is a timing chart representing the operation of the count control circuit shown in FIG. 20.

FIG. 21 is a timing chart representing the operation of count control circuit 241 shown in FIG. 20. Referring to FIG. 21, the operation of count control circuit 241 shown in FIG. 20 will be briefly described below.

According to a DLL reset command after power on, reset signal RESET is driven to the H level, the internal node of shifter 241c is initialized and enable signal bits EN[0] to EN[2] are initialized.

When down instruction signal DWN from shifter 42dc shown in FIG. 19 rises to the H level according to the phase detecting operation in phase difference detection circuit 909, the signal of the internal node is transferred in shifter 241c. During down instruction signal DWN is at the H level, a tri-state buffer in the output stage of shifter 240cis in an output high impedance state, and enable signal bits EN[0] to EN[2] are maintained at the L level by the latch in the output stage. Therefore, in this period, delay stage address signal A[0:2] from counting circuit 37 shown in FIG. 19 maintains the initial state, while delay stage address signal A[3:N] changes.

When down instruction signal DWN goes low, an output signal of inverter 241a goes high and responsively, an output signal of NOR gate 241b goes low. Therefore, an H-level signal internally transferred in shifter 241c is outputted via the tri-state buffer in the final output stage, and enable signal bits EN[0] to EN[2] rise to the H level. Thereafter, all of bits of delay stage address signal A[0:N] outputted from counting circuit 37 become valid and a delay amount is adjusted on the Δt basis.

Figure 22:
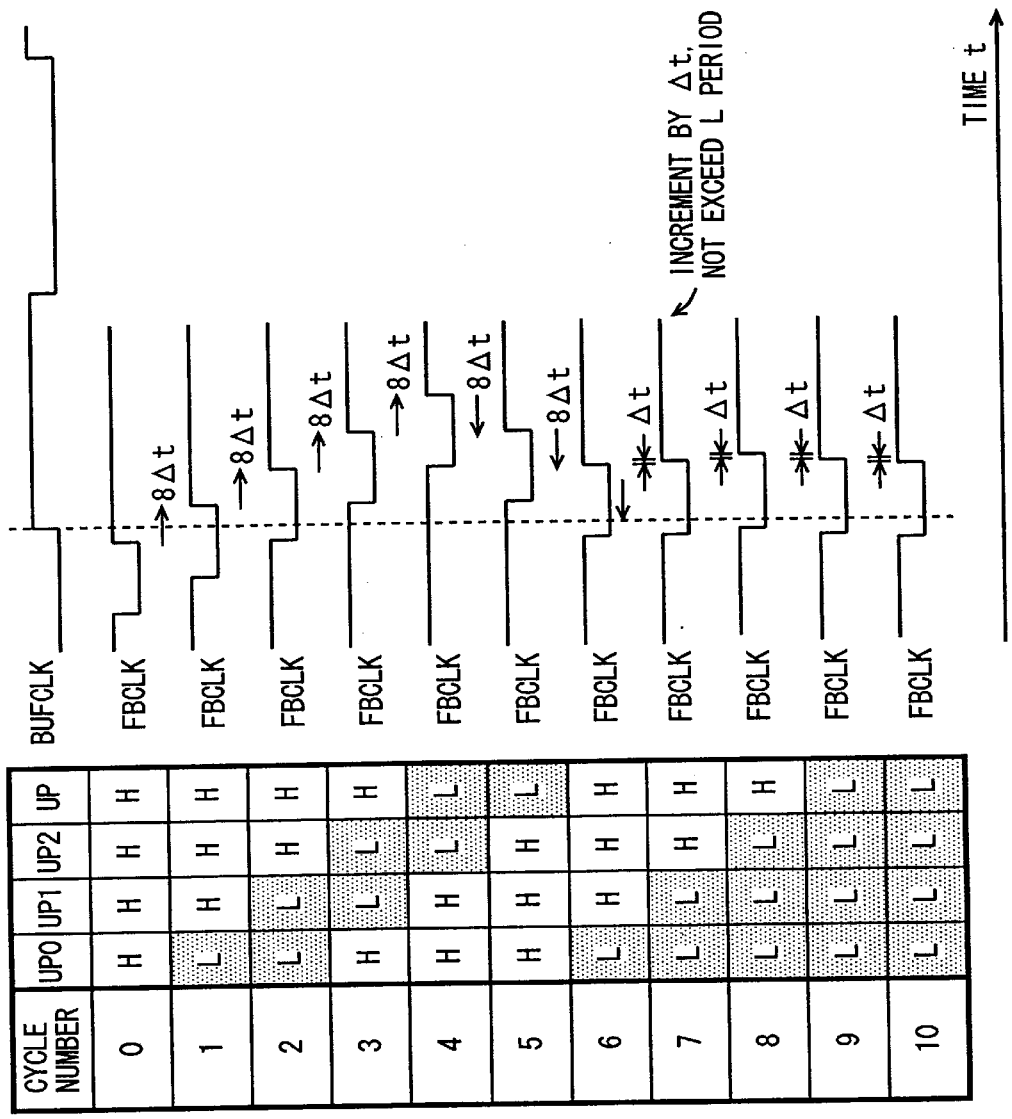
FIG. 22 is a diagram showing an adjusting operation of a DLL circuit shown in FIG. 19.
Figure 23:
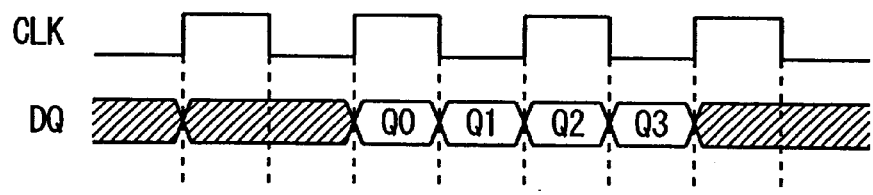
FIG. 23 is a timing chart representing an operation of outputting data at a double data rate.
Figure 24:
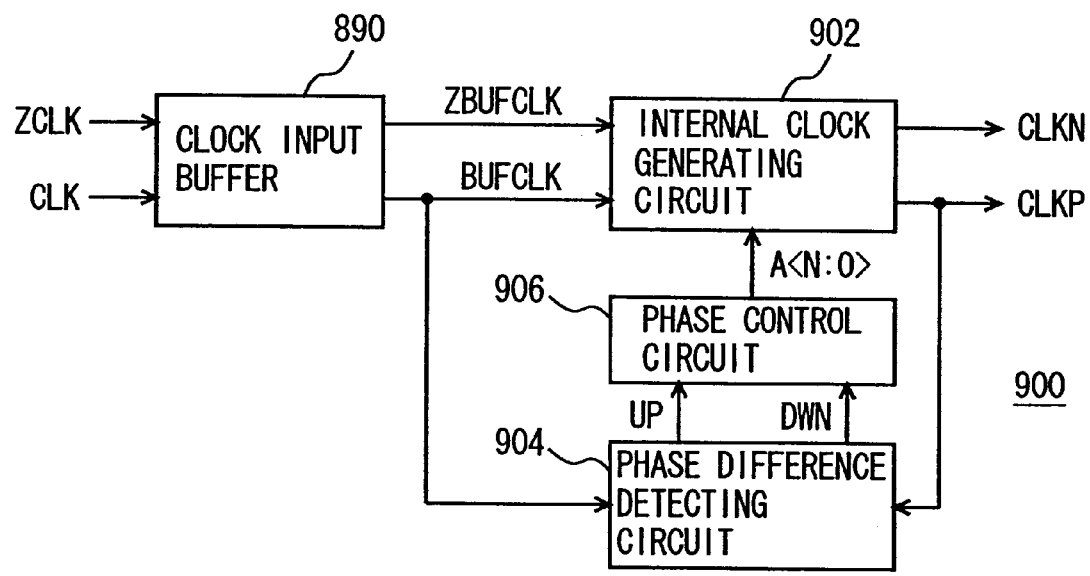
FIG. 24 is a diagram schematically showing the configuration of an internal clock generating circuit.
Figure 25:
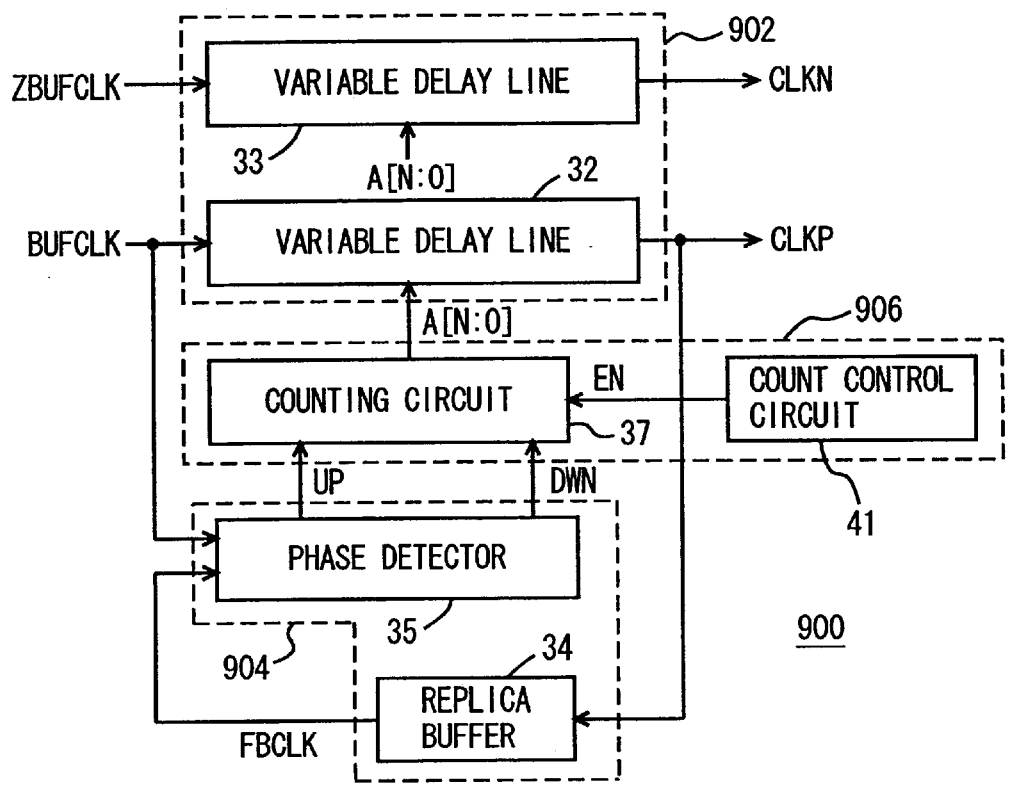
FIG. 25 is a diagram showing the configuration of the internal clock generating circuit shown in FIG. 24 more specifically.
Figure 26A:
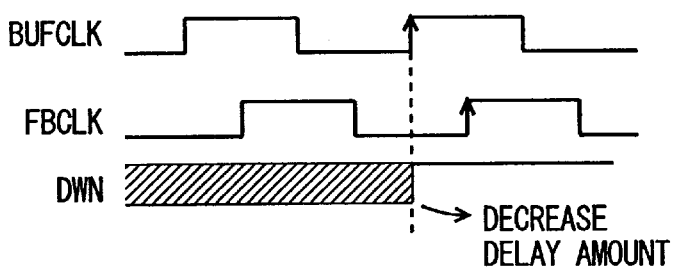
FIGS. 26A and 26B are timing charts representing the operation of a phase detector shown in FIG. 25.
Figure 26B:
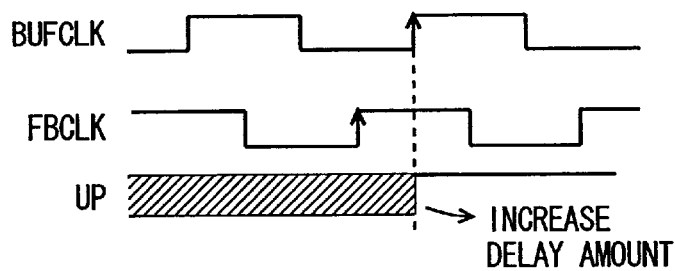
Figure 27:
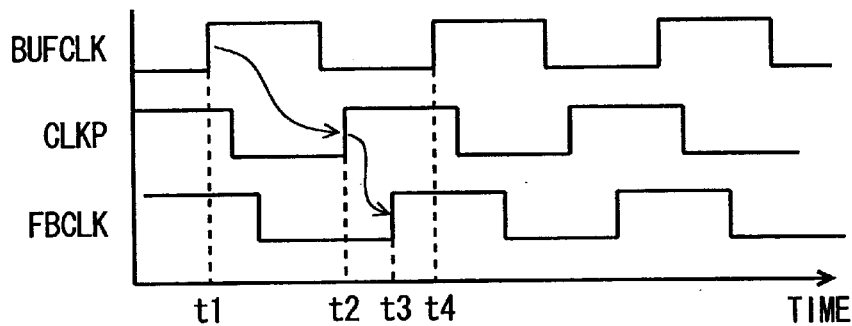
FIG. 27 is a timing chart representing the operation of the internal clock generating circuit shown in FIG. 25.
Figure 28:
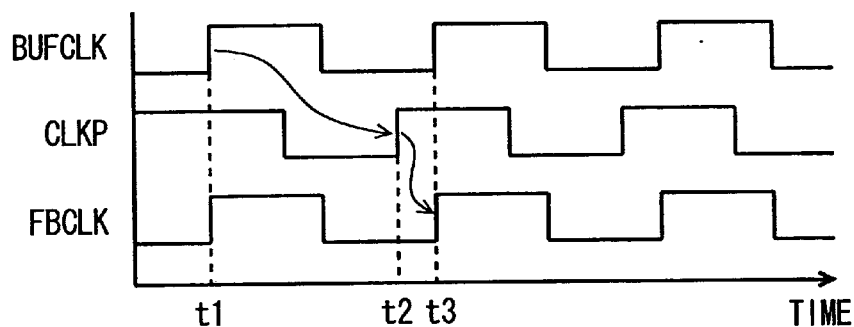
FIG. 28 is a timing chart representing the operation of the internal clock generating circuit shown in FIG. 25.
Figure 29:
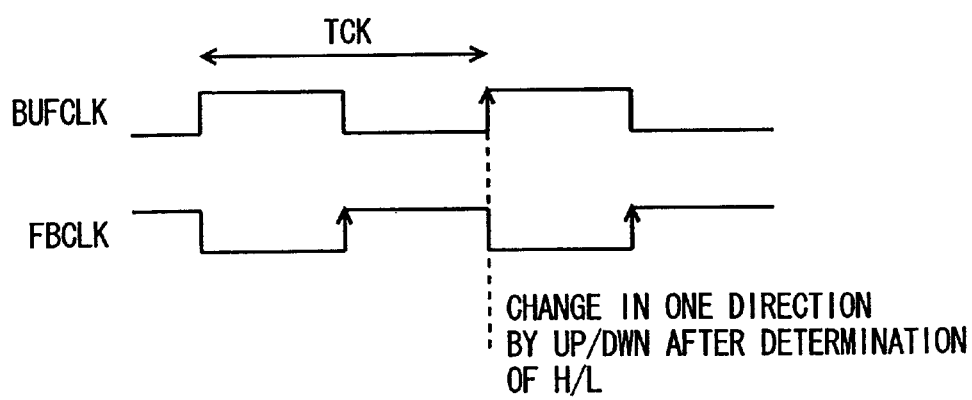
FIG. 29 is a timing chart representing the operation of a phase difference detecting circuit shown in FIG. 25.
Figure 30:
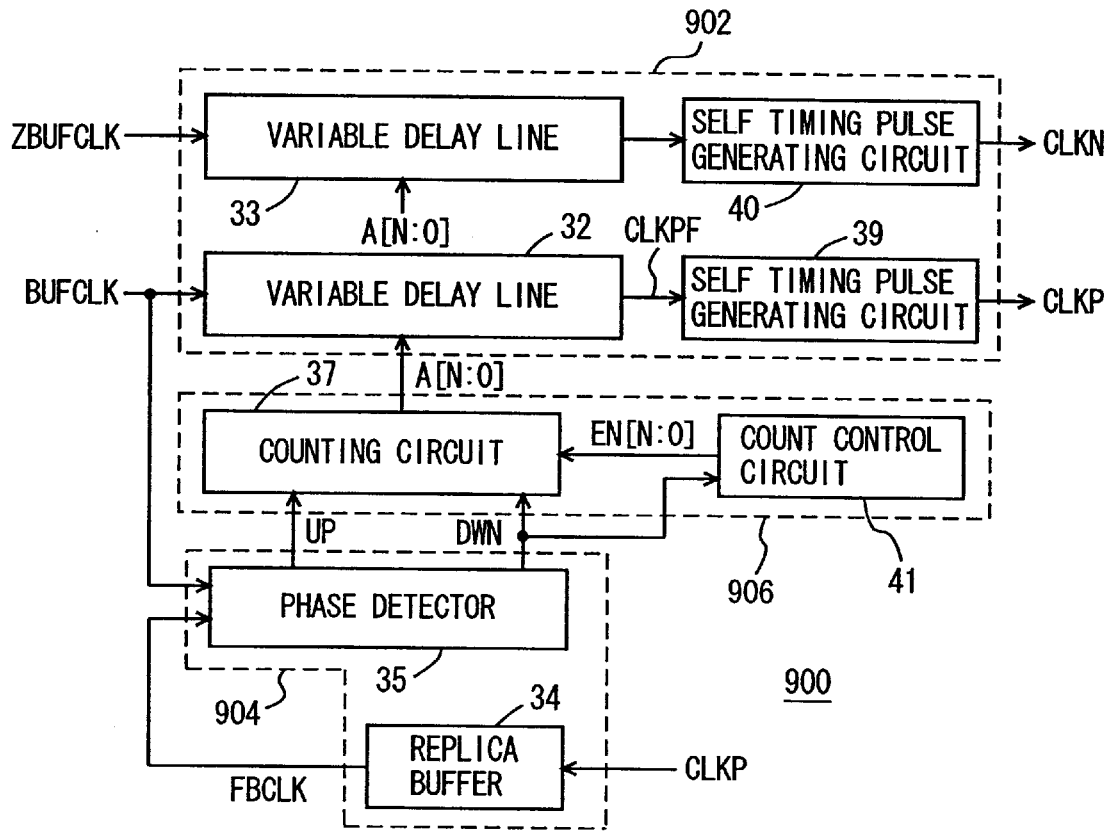
FIG. 30 is a diagram schematically showing another configuration of a conventional internal clock generating circuit.
Figure 31:
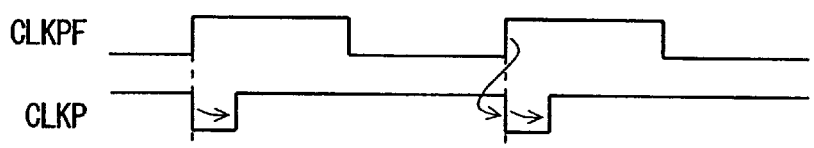
FIG. 31 is a timing chart representing the operation of a self timing pulse generating circuit shown in FIG. 30.
Figure 32:
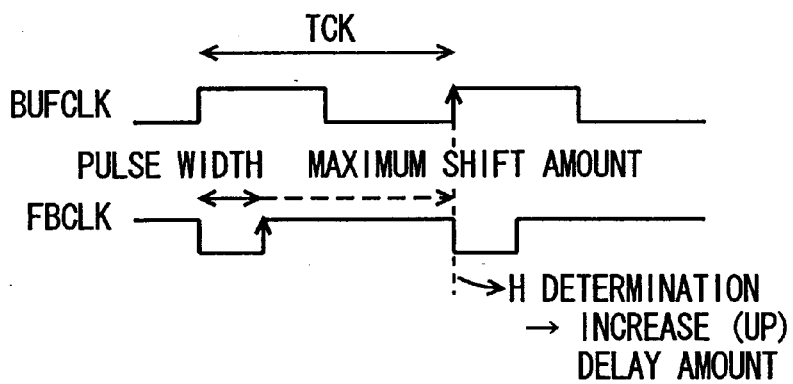
FIG. 32 is a timing chart representing the operation of a phase detector shown in FIG. 30.
Figure 33:
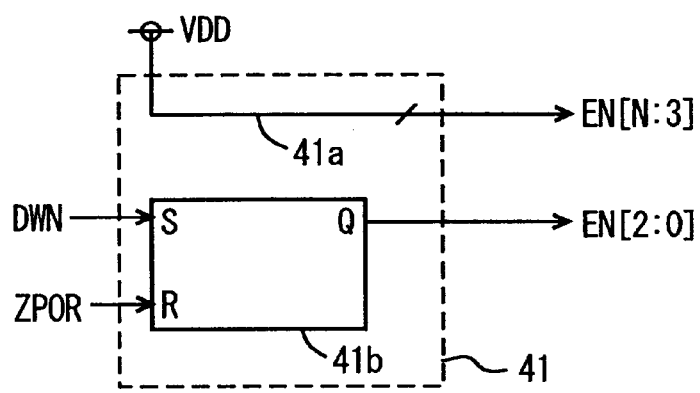
FIG. 33 is a diagram showing an example of the configuration of the count control circuit shown in FIG. 30.
Figure 34:
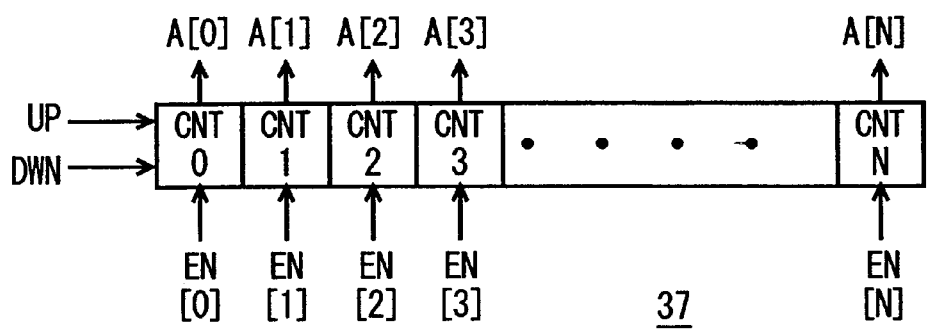
FIG. 34 is a diagram schematically showing the configuration of a counting circuit shown in FIG. 30.
Figure 35:
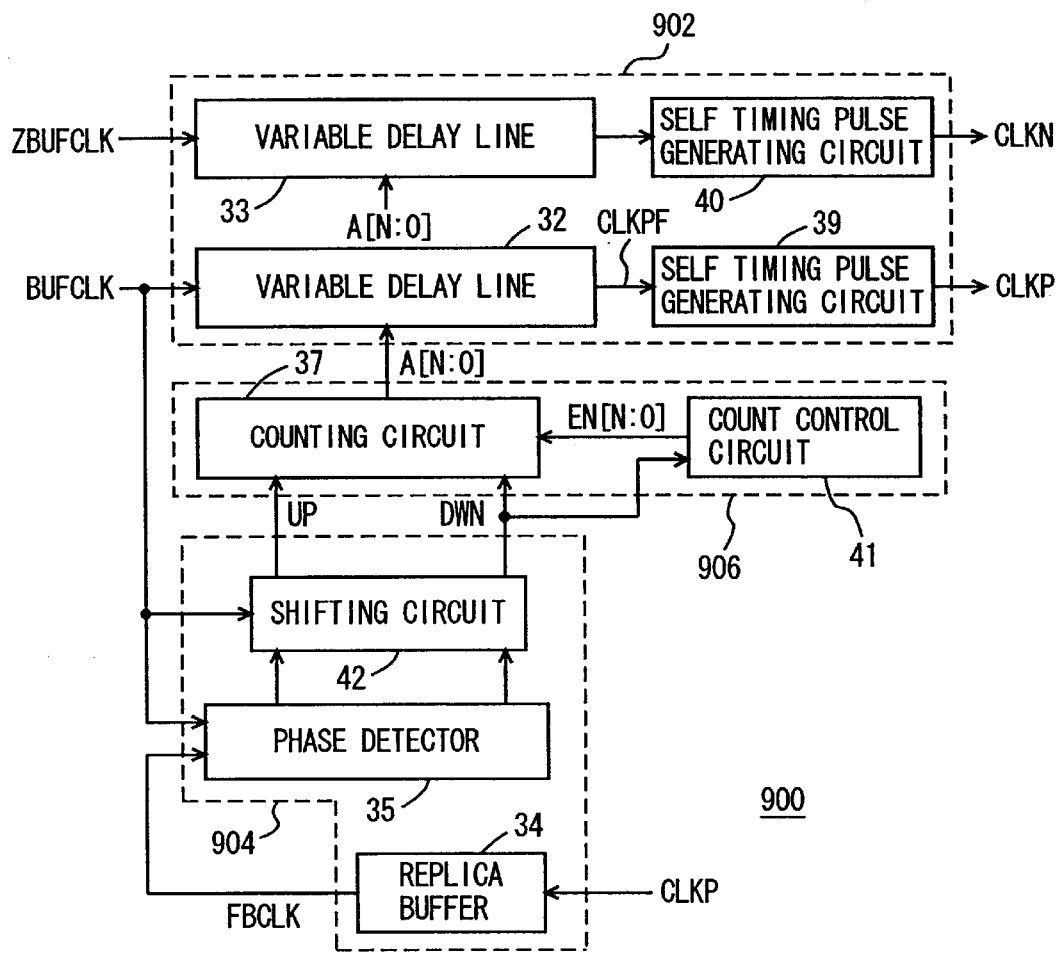
FIG. 35 is a diagram schematically showing further another configuration of a conventional internal clock generating circuit.

FIG. 22 is a diagram illustrating the operation of a DLL circuit according to the third embodiment of the present invention. Referring to FIG. 22, the operation of the DLL circuit shown in FIGS. 20 and 21 will be described below.

After resetting DLL circuit 16, by the phase detecting operation of phase detector 35, complementary up instruction signal UP and down instruction signal DWN are applied to counting circuit 37 via shifting circuit 42. To count control circuit 241, down instruction signal DWN is applied.

In clock cycle numbers 0 to 3, up instruction signal UP is at the H level, enable signal bits EN[0] to EN[2] are at the L level, and a delay amount is increased on basis of the 8 Δt step.

In clock cycle number 4, when up instruction signal UP falls to the L level, the phase of feedback clock signal FBCLK is advanced by 8 Δt. In the following clock cycle number 5 as well, up instruction signal UP is at the L level and the delay amount of feedback clock signal FBCLK is decreased again by 8 Δt.

In clock cycle number 5, synchronously with the falling edge of buffer clock BUFCLK, down instruction signal DWN goes low and accordingly, in count control circuit 241 shown in FIG. 20, enable signal bits EN[0] to EN[2] are set to the H level. All of bits A[0:N] of counting circuit 37 turn valid and the counting operation is performed using all of the bits. Therefore, in the subsequent cycles, the phase adjustment is carried out in Δt steps.

In clock cycle number 6, when up instruction signal UP rises to the H level, the delay amount of the phase of feedback clock signal FBCLK is increased by Δt. Subsequently, since enable signal bits EN[0] to EN[2] are at the H level, in variable delay lines 32 and 33, the delay amount is changed using all of delay stage address signal bits A[0] to A[N]. The delay amount is adjusted in the L level period in steps of the minimum delay amounts Δt, so that the rising edge of feedback clock signal FBCLK can be locked with the rising edge of buffered clock signal BUFCLK at high speed.

Since up instruction signal UP and down instruction signal DWN are transferred via shifting circuit 42, the delay stage address signal can be suppressed from entering a metastable state, and an internal clock signal can be generated stably.

In the foregoing first to third embodiments, as a self timing pulse, a pulse signal that is set to the L level for a predetermined period in response to the rising edge of an output signal of the variable delay line is used. Alternatively, a pulse signal that is set to the H level for a predetermined period in response to the rising edge of an output signal of the variable delay line is generated to be used as the self timing pulse signal. In this case, an output clock signal having a duty ratio of 50% from the variable delay line is used as a clock signal for data output, and the self timing pulse signal is used as the feedback clock signal. The rising edge of the self timing pulse signal is synchronized with the rising edge of an output signal of the variable delay line, and the self timing pulse signal is transmitted via the replica buffer to generate feedback clock signal FBCLK, and the phase adjustment relative to buffered clock signal BUFCLK is performed. In the case of such configuration, in place of down instruction signal DWN, up instruction signal UP is used to adjust/control the delay amount of the variable delay line. When the phase delay amount is excessively decreased due to the time lag of the shifter, the delay amount is increased to compensate for the excessive phase adjustment.

In the foregoing embodiments, the DDL circuit is used in the clock synchronous semiconductor memory device that operates in the DDR mode. The DDL circuit of the present invention can be generally applied to a circuit for generating an internal clock signal synchronized in phase with an external clock signal.

Delay circuits are cascaded to form an internal clock generating circuit for generating an internal clock signal while adjusting the number of stages of the delay circuits. As the internal clock generating circuit, a current controlled type delay circuit line, of which operation current is adjusted in accordance with a delay stage address signal, may be also used. The delay time is adjusted by adjusting the operation current, instead of changing the number of stages in the delay circuit. Therefore, as the internal clock generating circuit, any variable delay circuit having a delay time adjusted by an output count of a counting circuit can be used.

As described above, according to the present invention, when phase adjustment is performed excessively beyond the edge of the self timing pulse signal, the phase delay amount is controlled so as to compensate for the excessive phase adjustment. Thus, the phase of the internal clock signal can be synchronized with the phase of the external clock signal at high speed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. Clock generation circuitry comprising:
    an internal clock producing circuit for producing an internal clock signal in accordance with an external clock signal;
    a phase difference detecting circuit for detecting a phase difference between said internal clock signal and said external clock signal;
    a phase relation adjusting circuit according to an output signal of said phase difference detection circuit, for continuously maintaining a predetermine state for a predetermined number of clock cycle(s) when a phase relation between said internal clock signal and said external clock signal becomes said predetermined state, and releasing a maintained, predetermined state upon reaching to said predetermined number of clock cycle(s);
    a phase adjusting circuit for adjusting a phase of said internal clock signal in accordance with an output signal of said phase relation adjusting circuit; and
    a delay control circuit for setting a phase adjustment unit of said phase adjusting circuit to a first delay amount until said predetermined state by said phase relation adjusting circuit is released and for setting the phase adjustment unit of said phase adjusting circuit to a second delay amount smaller than said first delay amount in response to release of said predetermined state.

2. The clock generation circuitry according to claim 1, wherein
    said phase relation adjusting circuit includes:
        a delay circuit for delaying the output signal of said phase difference detecting circuit by a prescribed number of clock cycle(s);
        a forcibly setting circuit for forcibly setting the output signal of said phase relation adjusting circuit to said predetermined state when an output signal of said delay circuit is in said predetermined state; and
        a releasing circuit for releasing a forced setting by said forcibly setting circuit after elapse of said prescribed number of clock cycle(s).

3. The clock generation circuitry according to claim 2, wherein
    said prescribed number is equal to said predetermined number.

4. The clock generation circuitry according to claim 2, wherein
    said phase adjusting circuit includes
        a counter for counting an indication indicating said predetermined state of the output signal of said phase relation adjusting circuit and generating a count for setting a delay amount of said internal clock producing circuit, and
        said delay control circuit sets a count unit of said counter to a value corresponding to said first delay amount until said predetermined state indication of the output signal of said phase relation adjusting circuit is canceled.

5. The clock generation circuitry according to claim 4, wherein
    said internal clock producing circuit includes a variable delay circuit having a delay amount for delaying said external clock signal set according to the count of said counter.

6. The clock generation circuitry according to claim 1, wherein
    said internal clock producing circuit further includes a pulse generating circuit for generating a one-shot pulse signal in response to an edge of said internal clock signal and applying the one-shot pulse signal to said phase difference detecting circuit, said phase difference detection circuit detects the phase difference between said external clock signal and said one-shot pulse signal in place of said internal clock signal.

7. Clock generation circuitry comprising:
    an internal clock producing circuit for generating an internal clock signal in accordance with an external clock signal;
    a phase difference detecting circuit for detecting a phase difference between said internal clock signal and said external clock signal;
    a phase adjusting circuit for adjusting a phase difference between said internal clock signal and said external clock signal in accordance with an output signal of said phase difference detecting circuit; and
    a delay control circuit for adjusting a phase adjustment unit of said phase adjusting circuit in accordance with the output-signal of said phase difference detecting circuit, said delay control circuit increasing said phase adjustment unit from a first value to a second value for a predetermined cycle period in response to a predetermined state indication of the output signal of said phase difference detecting circuit, and setting said phase adjustment unit to a minimum value smaller than said first value in subsequent cycles.

8. The clock generation circuitry according to claim 7, wherein
    said internal clock producing circuit delays said external clock signal to generate said internal clock signal,
    said phase adjusting circuit includes a counter for counting said predetermined state instruction of the output signal of said phase difference detecting circuit and generating a count for setting a delay amount of said internal clock producing circuit, and
    said delay control circuit sets a prescribed bit(s) of said counter to a fixed state for said predetermined cycle(s)

in accordance with the output signal indicating said predetermined state from said phase difference detection circuit, and sets all bit to a valid state after said predetermined cycle(s), said counter performing the counting using the bits of the valid state, the count of the counter determining the delay amount in said internal clock producing circuit.

9. The clock generation circuitry according to claim 7, wherein said predetermined cycle period is a period of one clock cycle.

10. The clock generation circuitry according to claim 7, wherein said internal clock producing circuit includes a variable delay circuit for generating said internal clock signal by delaying said external clock signal, said delay control circuit includes:
a delay initializing circuit for delaying the output signal indicating said predetermined state by said predetermined cycle period to generate a first bit(s) when said first bit(s), initialized to an invalid state, is invalid; and
a delay updating circuit being set in response to the output signal indicating said predetermined state of said phase difference detecting circuit, for setting a second bit upper than said first bit into an invalid state, and setting said second bit into the valid state in response to the first bit output from said delay initializing circuit, a delay change amount of said internal clock producing circuit being set by the bit(s) in the valid state.

11. The clock generation circuitry according to claim 10, wherein said phase adjusting circuit includes
a counting circuit for counting said predetermined state indication of the output signal of said phase difference detecting circuit,
a count step of said counting circuit is set by the first and second bits outputted from said delay control circuit, and
a delay amount of said internal clock producing circuit is set by an output count of said counting circuit.

12. The clock generation circuitry according to claim 7, wherein said phase difference detecting circuit includes:
a phase detector for detecting the phase difference between said external clock signal and said internal clock signal; and
a shifting circuit for delaying an output signal of said phase detector by a prescribed cycle period, to generate said output signal of said phase difference detecting circuit.

13. The clock generation circuitry according to claim 7, wherein said internal clock producing circuit further includes a pulse generating circuit for generating a one-shot pulse signal in response to an edge of said internal clock signal and applying the one-shot pulse signal to said phase difference detecting circuit, said phase difference detecting circuit detecting a phase difference between the external clock signal and the one-shot pulse signal in place of the internal clock signal.

14. Clock generation circuitry comprising:

an internal clock producing circuit for generating an internal clock signal in accordance with an external clock signal;

a phase difference detecting circuit for detecting a phase difference between said internal clock signal and said external clock signal;

a phase adjusting circuit for adjusting a phase difference between said internal clock signal and said external clock signal in accordance with an output signal of said phase difference detecting circuit; and a delay control circuit for adjusting a phase adjustment unit of said phase adjusting circuit in accordance with an output signal of said phase difference detecting circuit, said delay control circuit initializing said phase adjustment unit to a first value greater than a minimum value, and setting said phase adjustment unit to said minimum value in response to release of a predetermined state indication of the output signal of said phase difference detecting circuit.

15. The clock generation circuitry according to claim 14, wherein said phase difference detecting circuit includes:
a phase detector for detecting the phase difference between said external clock signal and said internal clock signal: and
a shifting circuit for delaying an output signal of said phase detector by a predetermined clock cycle(s) to said phase adjusting circuit.

16. The clock generation circuitry according to claim 14, wherein said phase adjusting circuit includes
a counter for counting said predetermined state indication of the output signal of said phase difference detecting circuit and generating a count for setting a delay amount of said internal clock producing circuit,
said internal clock producing circuit includes a variable delay line having a delay time set according to the count of said counter,
said delay control circuit sets a predetermined bit(s) of the count of said counter to a fixed state at the time of initialization, and sets and maintains said predetermined bit(s) in a valid state in response to completion of said predetermined state indicated by the output signal of said phase adjusting circuit, and
said counter has the counting operation inhibited with respect to the bit(s) in the fixed state and allowed with respect to the bits in the valid state.

17. The clock generation circuitry according to claim 14, wherein said internal clock producing circuit further includes a pulse generating circuit for generating a one-shot pulse signal in response to an edge of said internal clock signal and applying the one-shot pulse signal to said phase difference detecting circuit, said phase difference detecting circuit detecting the phase difference between the external clock signal and the one-shot pulse signal in place of the internal clock signal.

* * * * *